United States Patent
Cho et al.

(10) Patent No.: US 12,394,741 B2
(45) Date of Patent: *Aug. 19, 2025

(54) INTEGRATED CIRCUIT PACKAGES HAVING ADHESION LAYERS FOR THROUGH VIAS

(71) Applicant: Taiwan Semiconductor Manufacturing Co., Ltd., Hsinchu (TW)

(72) Inventors: Hung-Chun Cho, Hsinchu (TW); Sih-Hao Liao, New Taipei (TW); Yu-Hsiang Hu, Hsinchu (TW); Hung-Jui Kuo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/656,277

(22) Filed: May 6, 2024

(65) Prior Publication Data

US 2024/0297140 A1 Sep. 5, 2024

Related U.S. Application Data

(60) Continuation of application No. 18/330,616, filed on Jun. 7, 2023, now Pat. No. 12,009,331, which is a (Continued)

(51) Int. Cl.
*H01L 23/00* (2006.01)
*H01L 21/56* (2006.01)
(Continued)

(52) U.S. Cl.
CPC .............. *H01L 24/20* (2013.01); *H01L 21/56* (2013.01); *H01L 23/293* (2013.01);
(Continued)

(58) Field of Classification Search
CPC . H01L 21/56; H01L 23/3142; H01L 23/3135; H01L 23/481; H01L 23/5384;
(Continued)

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

CN 111128905 A 5/2020
JP 2003101175 A 4/2003
(Continued)

*Primary Examiner* — Didarul A Mazumder
(74) *Attorney, Agent, or Firm* — Slater Matsil, LLP

(57) ABSTRACT

In an embodiment, a device includes: a semiconductor die including a semiconductor material; a through via adjacent the semiconductor die, the through via including a metal; an encapsulant around the through via and the semiconductor die, the encapsulant including a polymer resin; and an adhesion layer between the encapsulant and the through via, the adhesion layer including an adhesive compound having an aromatic compound and an amino group, the amino group bonded to the polymer resin of the encapsulant, the aromatic compound bonded to the metal of the through via, the aromatic compound being chemically inert to the semiconductor material of the semiconductor die.

20 Claims, 20 Drawing Sheets

Related U.S. Application Data division of application No. 17/338,872, filed on Jun. 4, 2021, now Pat. No. 11,715,717.

(60) Provisional application No. 63/162,650, filed on Mar. 18, 2021.

(51) Int. Cl.
| | |
|---|---|
| *H01L 23/29* | (2006.01) |
| *H01L 23/31* | (2006.01) |
| *H01L 23/48* | (2006.01) |
| *H01L 23/538* | (2006.01) |
| *H01L 25/065* | (2023.01) |

(52) U.S. Cl.
CPC ...... *H01L 23/3135* (2013.01); *H01L 23/3142* (2013.01); *H01L 23/481* (2013.01); *H01L 23/5384* (2013.01); *H01L 24/13* (2013.01); *H01L 25/0655* (2013.01); *H01L 2224/2101* (2013.01); *H01L 2924/35121* (2013.01); *H01L 2924/37001* (2013.01)

(58) Field of Classification Search
CPC ........... H01L 2924/18162; H01L 24/19; H01L 23/5389; H01L 23/293; H01L 2225/1035; H01L 21/568; H01L 25/0655; H01L 25/105
USPC ........ 257/774; 438/629, 637, 639, 640, 667, 438/668, 672, 675, 700, 701, 713, 978
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,252,065 B2 | 2/2016 | Lin et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,688,704 B2 | 6/2017 | Miura et al. |
| 10,515,901 B2 | 12/2019 | Lin et al. |
| 10,971,485 B2 | 4/2021 | Lee et al. |
| 11,676,940 B2 * | 6/2023 | Fu ............ H01L 25/50 257/774 |
| 12,009,331 B2 * | 6/2024 | Cho ............ H01L 24/13 |
| 2010/0237495 A1 | 9/2010 | Pagaila et al. |
| 2014/0252646 A1 | 9/2014 | Hung et al. |
| 2015/0145142 A1 * | 5/2015 | Lin ............ H01L 23/481 257/774 |
| 2016/0079196 A1 * | 3/2016 | Teh ............ H01L 23/50 257/773 |
| 2016/0093571 A1 * | 3/2016 | Kim ............ H01L 23/5389 257/774 |
| 2020/0043855 A1 * | 2/2020 | Lu ............ H01L 21/565 |
| 2020/0083189 A1 | 3/2020 | Chen et al. |
| 2020/0120794 A1 | 4/2020 | Somada et al. |
| 2020/0176384 A1 * | 6/2020 | Wu ............ H01L 25/0655 |
| 2020/0176397 A1 | 6/2020 | Liu et al. |
| 2021/0005554 A1 | 1/2021 | Huang et al. |

FOREIGN PATENT DOCUMENTS

| | | |
|---|---|---|
| KR | 20150059635 A | 6/2015 |
| KR | 20190038253 A | 4/2019 |
| TW | 202011554 A | 3/2020 |
| WO | 2019004264 A1 | 1/2019 |

* cited by examiner

INTEGRATED CIRCUIT PACKAGES HAVING ADHESION LAYERS FOR THROUGH VIAS

PRIORITY CLAIM AND CROSS-REFERENCE

This application is a continuation of U.S. patent application Ser. No. 18/330,616, filed on Jun. 7, 2023, entitled "Methods of Forming Integrated Circuit Packages Having Adhesion Layers Over Through Vias," which is a divisional of U.S. patent application Ser. No. 17/338,872, filed on Jun. 4, 2021, entitled "Methods of Forming Integrated Circuit Packages Having Adhesion Layers Over Through Vias," now U.S. Pat. No. 11,715,717, issued on Aug. 1, 2023, which claims the benefit of U.S. Provisional Application No. 63/162,650, filed on Mar. 18, 2021, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
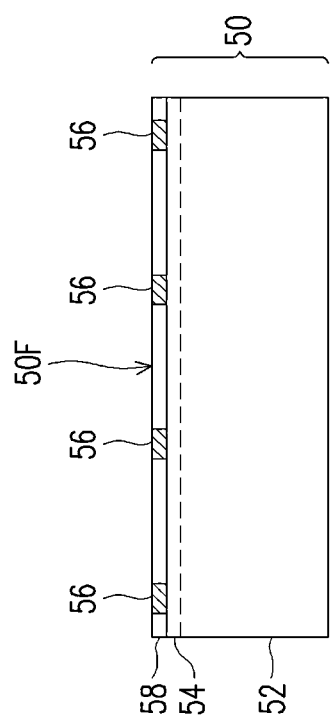
FIG. 1 is a cross-sectional view of an integrated circuit die.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, conductive features are formed for an integrated circuit package, and adhesion layers are formed on the conductive features. The adhesion layers are formed of an adhesive compound that can be selectively deposited on the conductive features. An encapsulant is then formed around the conductive features and the other features of the integrated circuit package. The adhesive compound chemically bonds to the material of the conductive features and the material of the encapsulant. The adhesion strength between the conductive features and the surrounding encapsulant may thus be improved.

FIG. 1 is a cross-sectional view of an integrated circuit die 50. Multiple integrated circuit dies 50 will be packaged in subsequent processing to form integrated circuit packages. Each integrated circuit die 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The integrated circuit die 50 may be formed in a wafer, which may include different die regions that are singulated in subsequent steps to form a plurality of integrated circuit dies 50. The integrated circuit die 50 includes a semiconductor substrate 52, an interconnect structure 54, die connectors 56, and a dielectric layer 58.

The semiconductor substrate 52 may be a substrate of silicon, doped or undoped, or an active layer of a semiconductor-on-insulator (SOI) substrate. The semiconductor substrate 52 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 52 has an active surface (e.g., the surface facing upward) and an inactive surface (e.g., the surface facing downward). Devices are at the active surface of the semiconductor substrate 52. The devices may be active devices (e.g., transistors, diodes, etc.), capacitors, resistors, etc. The inactive surface may be free from devices.

The interconnect structure 54 is over the active surface of the semiconductor substrate 52, and is used to electrically connect the devices of the semiconductor substrate 52 to form an integrated circuit. The interconnect structure 54 may include one or more dielectric layer(s) and respective metallization layer(s) in the dielectric layer(s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layers may include conductive vias and/or conductive lines to interconnect the devices of the semiconductor substrate 52. The metallization layers may be formed of a conductive material, such as a metal, such as copper, cobalt, aluminum, gold, combinations thereof, or the like. The interconnect structure 54 may be formed by a damascene process, such as a single damascene process, a dual damascene process, or the like.

Die connectors 56 are at the front side 50F of the integrated circuit die 50. The die connectors 56 may be conductive pillars, pads, or the like, to which external connections are made. The die connectors 56 are in and/or on the interconnect structure 54. For example, the die connectors 56 may be part of an upper metallization layer of the interconnect structure 54. The die connectors 56 can be formed of a metal, such as copper, aluminum, or the like, and can be formed by, for example, plating, or the like.

Optionally, solder regions (not separately illustrated) may be disposed on the die connectors 56 during formation of the integrated circuit die 50. The solder regions may be used to perform chip probe (CP) testing on the integrated circuit die 50. For example, the solder regions may be solder balls, solder bumps, or the like, which are used to attach a chip probe to the die connectors 56. Chip probe testing may be performed on the integrated circuit die 50 to ascertain whether the integrated circuit die 50 is a known good die (KGD). Thus, only integrated circuit dies 50, which are KGDs, undergo subsequent processing are packaged, and dies which fail the chip probe testing are not packaged. After testing, the solder regions may be removed in subsequent processing steps.

A dielectric layer 58 is at the front side 50F of the integrated circuit die 50. The dielectric layer 58 is in and/or on the interconnect structure 54. For example, the dielectric layer 58 may be an upper dielectric layer of the interconnect structure 54. The dielectric layer 58 laterally encapsulates the die connectors 56. The dielectric layer 58 may be an oxide, a nitride, a carbide, a polymer, the like, or a combination thereof. The dielectric layer 58 may be formed, for example, by spin coating, lamination, chemical vapor deposition (CVD), or the like. Initially, the dielectric layer 58 may bury the die connectors 56, such that the top surface of the dielectric layer 58 is above the top surfaces of the die connectors 56. The die connectors 56 are exposed through the dielectric layer 58 during formation of the integrated circuit die 50. Exposing the die connectors 56 may remove any solder regions that may be present on the die connectors 56. A removal process can be applied to the various layers to remove excess materials over the die connectors 56. The removal process may be a planarization process such as a chemical mechanical polish (CMP), an etch-back, combinations thereof, or the like. After the planarization process, top surfaces of the die connectors 56 and the dielectric layer 58 are substantially coplanar (within process variations) and are exposed at the front side 50F of the integrated circuit die 50.

In some embodiments, the integrated circuit die 50 is a stacked device that includes multiple semiconductor substrates 52. For example, the integrated circuit die 50 may be a memory device that includes multiple memory dies such as a hybrid memory cube (HMC) device, a high bandwidth memory (HBM) device, or the like. In such embodiments, the integrated circuit die 50 includes multiple semiconductor substrates 52 interconnected by through-substrate vias (TSVs) such as through-silicon vias. Each of the semiconductor substrates 52 may (or may not) have a separate interconnect structure 54.

FIGS. 2-10 are cross-sectional views of intermediate stages in the manufacturing of integrated circuit packages 100, in accordance with some embodiments. Specifically, integrated circuit packages 100 are formed by packaging one or more integrated circuit dies 50 in package regions 102A. Processing of one package region 102A is illustrated, but it should be appreciated that any number of package regions 102A can be simultaneously processed. The package regions 102A will be singulated in subsequent processing to form the integrated circuit packages 100.

Figure 2:
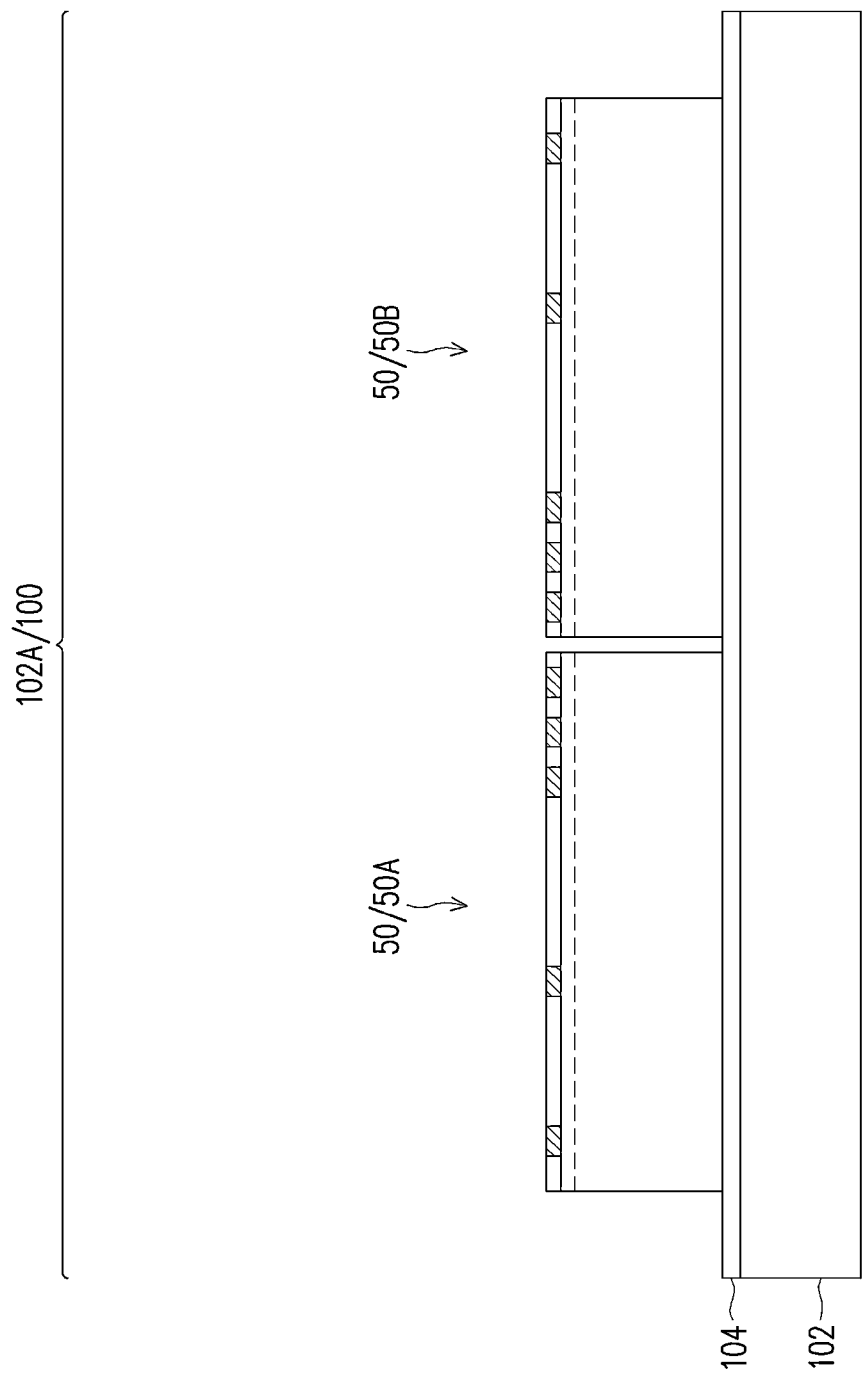
FIGS. 2-10 are cross-sectional views of intermediate stages in the manufacturing of integrated circuit packages, in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be planarized and may have a high degree of planarity.

Semiconductor dies such as integrated circuit dies 50 (e.g., a first integrated circuit die 50A and a second integrated circuit die 50B) are placed on the release layer 104. A desired type and quantity of integrated circuit dies 50 are placed in each of the package regions 102A. The integrated circuit dies 50 may be placed by, e.g., a pick-and-place process. In the embodiment shown, multiple integrated circuit dies 50 are placed adjacent one another, including the first integrated circuit die 50A and the second integrated circuit die 50B in each of the package regions 102A. The first integrated circuit die 50A may be a logic device, such as a central processing unit (CPU), graphics processing unit (GPU), system-on-a-chip (SoC), microcontroller, or the like. The second integrated circuit die 50B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 50A, 50B may be the same type of dies, such as SoC dies. The first integrated circuit die 50A and the second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A, 50B may have different sizes (e.g., different heights and/or surface areas), or may have the same size (e.g., same heights and/or surface areas).

Figure 3:
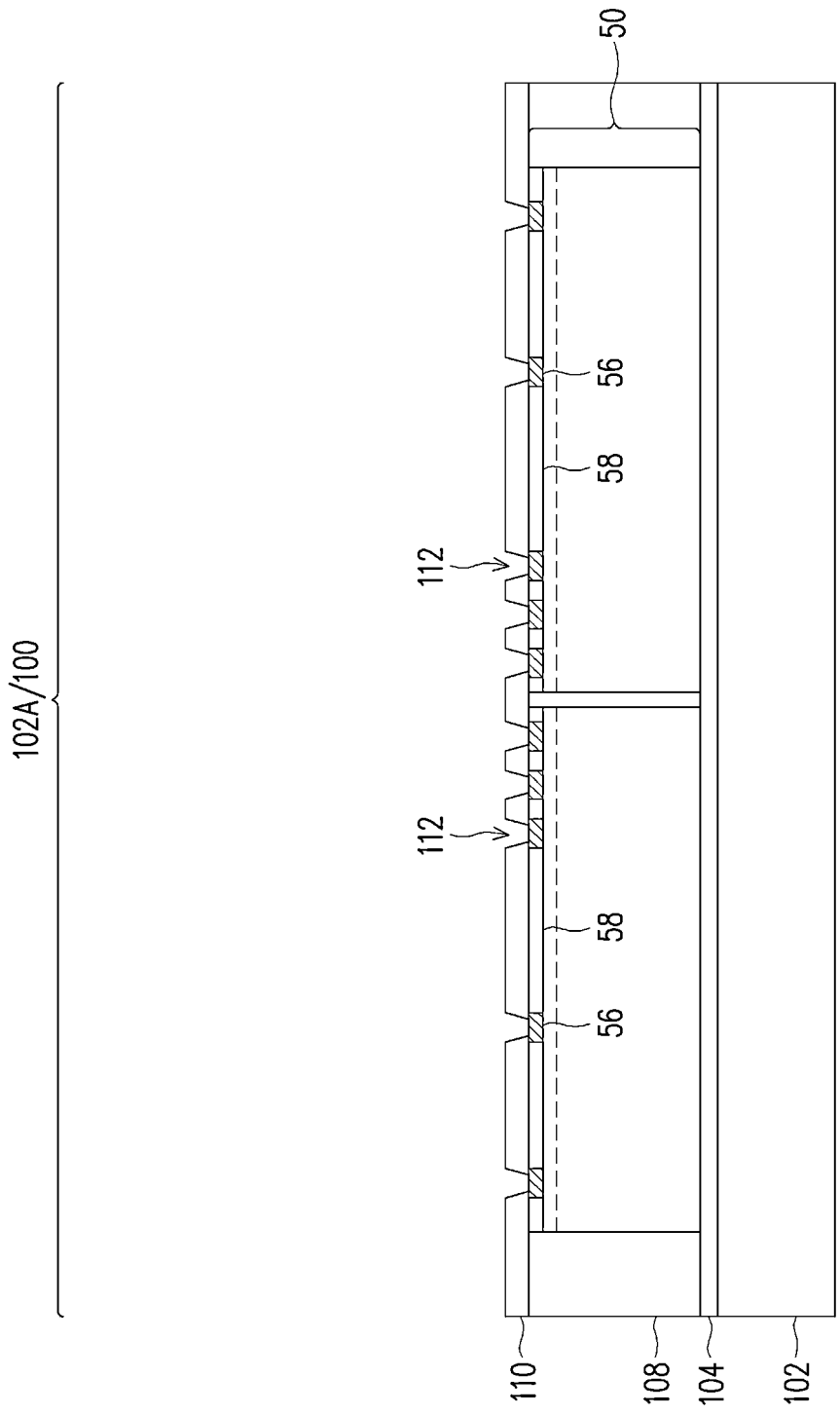

In FIG. 3, an encapsulant 108 is formed around the integrated circuit dies 50 and on the release layer 104. After formation, the encapsulant 108 encapsulates the integrated circuit dies 50. The encapsulant 108 may be a molding compound, epoxy, or the like. In some embodiments, the encapsulant 108 includes a polymer resin having fillers disposed therein. The encapsulant 108 may be applied by compression molding, transfer molding, or the like, and may be dispensed over the carrier substrate 102 such that the integrated circuit dies 50 are buried or covered. The encapsulant 108 is further dispensed in gap regions between the integrated circuit dies 50. The encapsulant 108 may be applied in liquid or semi-liquid form and then subsequently cured. A planarization process may be performed on the encapsulant 108 to expose the die connectors 56 of the integrated circuit dies 50. The planarization process may remove material of the encapsulant 108 and the integrated circuit dies 50 (e.g., the die connectors 56 and the dielectric layer 58) until the die connectors 56 are exposed. After the planarization process, top surfaces of the encapsulant 108 and the integrated circuit dies 50 (e.g., the die connectors 56 and the dielectric layer 58) are substantially coplanar (within process variations). The planarization process may be, for example, a chemical-mechanical polish (CMP), a grinding process, or the like. In some embodiments, the planarization process may be omitted, for example, if the die connectors 56 are already exposed.

A dielectric layer 110 is then deposited on the encapsulant 108 and the integrated circuit dies 50 (e.g., on the die connectors 56 and the dielectric layer 58). The dielectric layer 110 may be formed of a photosensitive material which may be patterned using a lithography mask, such as PBO, polyimide, a BCB-based polymer, a cyclic olefin copolymer, an acryl-based copolymer, or the like, which may be formed by spin coating, lamination, CVD, or the like. Other acceptable dielectric materials formed by any acceptable process may be used. The dielectric layer 110 is then patterned. The patterning forms openings 112 in the dielectric layer 110 exposing portions of the die connectors 56. The patterning may be performed by an acceptable process, such as by exposing the dielectric layer 110 to light and developing it when the dielectric layer 110 is a photosensitive material, or by etching using, for example, an anisotropic etch.

Figure 4:
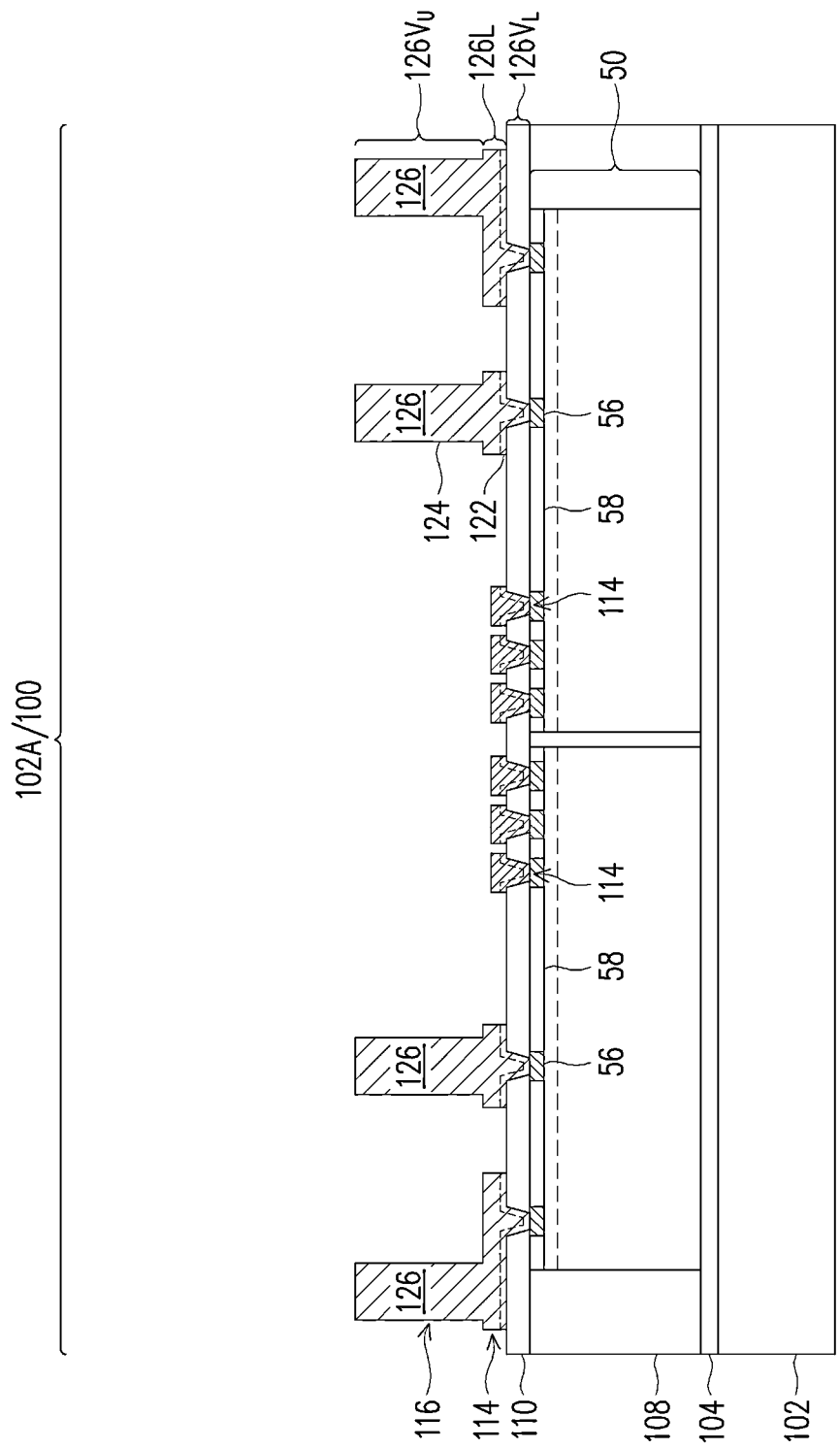

In FIG. 4, under-bump metallurgy layers (UBMLs) 114 are formed in the openings 112. The UBMLs 114 have line portions on and extending along the major surface of the dielectric layer 110, and via portions extending through the dielectric layer 110 to physically and electrically couple the UBMLs 114 to the die connectors 56 of the integrated circuit dies 50. Through vias 116 are formed on the line portions of the UBMLs 114, with some of the UBMLs 114 remaining free of the through vias 116. The UBMLs 114 and the through vias 116 will be used for connection to higher layers of the integrated circuit package 100.

As an example to form the UBMLs 114 and the through vias 116, a seed layer 122 is formed over the dielectric layer 110 and in the openings 112. In some embodiments, the seed layer 122 is a metal layer, which may be a single layer or a composite layer comprising a plurality of sub-layers formed of different materials. In some embodiments, the seed layer 122 includes a titanium layer and a copper layer over the titanium layer. The seed layer 122 may be formed using, for example, PVD or the like. A first photoresist is then formed and patterned on the seed layer 122. The first photoresist may be formed by spin coating or the like and may be exposed to light for patterning. The pattern of the first photoresist corresponds to the UBMLs 114. The patterning forms openings through the first photoresist to expose the seed layer 122. A metal 124 is then formed in the openings of the first photoresist and on the exposed portions of the seed layer 122. The metal 124 may be formed by plating, such as electroless plating or electroplating from the seed layer 122, or the like. The metal 124 may be formed of copper, titanium, tungsten, aluminum, or the like. The first photoresist may be removed by an acceptable ashing or stripping process, such as using an oxygen plasma or the like. A second photoresist is then formed and patterned on the seed layer 122 and the metal 124. The second photoresist may be formed by spin coating or the like and may be exposed to light for patterning. The pattern of the second photoresist corresponds to the through vias 116. Additional portions of the metal 124 are then formed in the openings of the second photoresist. The additional portions of the metal 124 may be formed by plating, such as electroless plating or electroplating from the original portions of the metal 124 that was plated from the seed layer 122, or the like. In some embodiments, no seed layers are formed between the various portions of the metal 124, so that the metal 124 is a single continuous metal layer. The second photoresist and portions of the seed layer 122 on which the metal 124 is not formed are removed. The second photoresist may be removed by an acceptable ashing or stripping process, such as using an oxygen plasma or the like. After the second photoresist is removed, exposed portions of the seed layer 122 are removed, such as by using an acceptable etching process, such as by wet or dry etching. The remaining portions of the seed layer 122 and the metal 124 form conductive features 126. The conductive features 126 have upper via portions $126V_U$ (corresponding to the through vias 116), line portions 126L (corresponding to the line portions of the UBMLs 114), and lower via portions $126V_L$ (corresponding to the via portions of the UBMLs 114). The upper via portions $126V_U$ may be laterally offset from the lower via portions $126V_L$.

Figure 5:
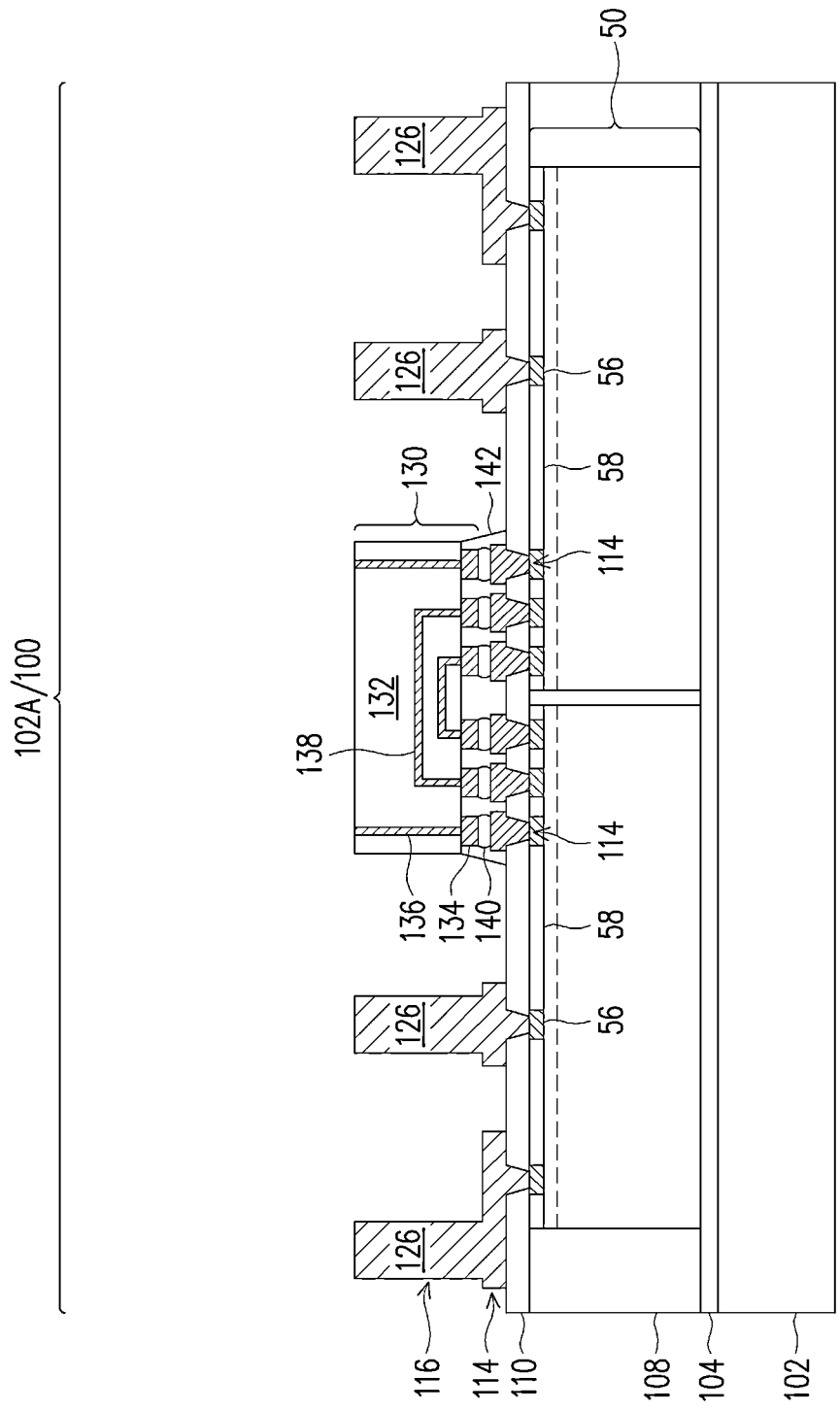

In FIG. 5, semiconductor dies such as interconnection dies 130 are attached to the UBMLs 114. The interconnection dies 130 may be local silicon interconnects (LSIs), large scale integration packages, interposer dies, or the like. The interconnection dies 130 include substrates 132, with conductive features formed in and/or on the substrates 132. The substrates 132 may be semiconductor substrates, dielectric layers, or the like. The interconnection dies 130 are connected to the UBMLs 114 using die connectors 134 disposed at the front side of the interconnection dies 130. Some of the die connectors 134 may be electrically coupled to the back side of the interconnection dies 130 with through-substrate vias (TSVs) 136 that extend into or through the substrate 132. In the illustrated embodiment, the TSVs 136 extend through the substrate 132 so that they are exposed at the back sides of the interconnection dies 130. In another embodiment, a material of the interconnection dies 130 (e.g., a dielectric material or semiconductor material) may be covering the TSVs 136.

In embodiments where the interconnection dies 130 are LSIs, the interconnection dies 130 may be bridge structures that include die bridges 138. The die bridges 138 may be metallization layers formed in and/or on, e.g., the substrates 132, and work to interconnect each die connector 134 to another die connector 134. As such, the LSIs can be used to directly connect and allow communication between the integrated circuit dies 50 (e.g., the integrated circuit dies 50A, 50B, see FIG. 2). In such embodiments, the interconnection dies 130 can be placed over a region that is disposed between the integrated circuit dies 50 so that each of the interconnection dies 130 overlaps the underlying integrated circuit dies 50. In some embodiments, the interconnection dies 130 may further include logic devices and/or memory devices.

Conductive connectors 140 are formed adjacent the UBMLs 114 and/or the die connectors 134. The conductive connectors 140 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 140 may include a conductive material such as solder, copper, aluminum, gold, nickel, silver, palladium, tin, the like, or a combination thereof. In some embodiments, the conductive connectors 140 are formed by initially forming a layer of solder through evaporation, electroplating, printing, solder transfer, ball placement, or the like. Once a layer of solder has been formed on the structure, a reflow may be performed in order to shape the material into the desired bump shapes. The interconnection dies 130 are connected to the UBMLs 114 using the conductive connectors 140. Connecting the interconnection dies 130 may include placing the interconnection dies 130 and reflowing the conductive connectors 140 to physically and electrically couple the die connectors 134 to the underlying UBMLs 114.

In some embodiments, an underfill 142 is formed around the conductive connectors 140, and between the dielectric layer 110 and the interconnection dies 130. The underfill 142 may reduce stress and protect the joints resulting from the reflowing of the conductive connectors 140. The underfill 142 may also be included to securely bond the interconnection dies 130 to the dielectric layer 110 and provide structural support and environmental protection. The underfill 142 may be formed of a molding compound, epoxy, or the like. The underfill 142 may be formed by a capillary flow process after the interconnection dies 130 are attached, or may be formed by a suitable deposition method before the interconnection dies 130 are attached. The underfill 142 may be applied in liquid or semi-liquid form and then subsequently cured.

Figure 6:
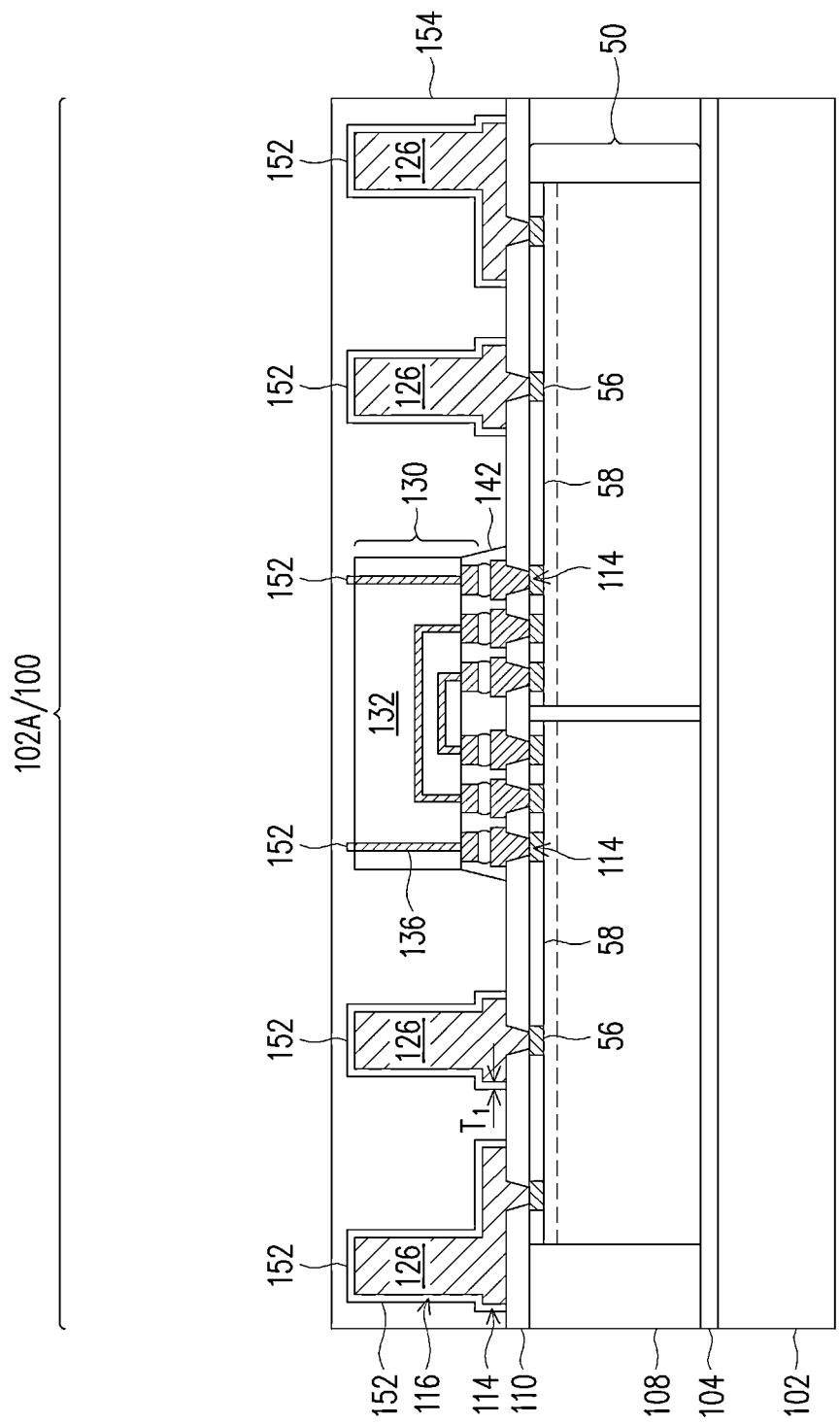

In FIG. 6, adhesion layers 152 are conformally formed on the top surfaces and the sidewalls of the conductive features 126 (e.g., the UBMLs 114 and the through vias 116). The adhesion layers 152 may also be formed on the top surfaces of the TSVs 136 (if they are exposed at the back sides of the interconnection dies 130). An encapsulant 154 is then formed around the conductive features 126 and the interconnection dies 130, so that the adhesion layers 152 are disposed between the encapsulant 154 and the conductive features 126. The composition and formation methods of the adhesion layers 152 and the encapsulant 154 will be subsequently described in greater detail for FIGS. 7A-7D. After formation, the encapsulant 154 encapsulates the conductive features 126/adhesion layers 152 and the interconnection dies 130. The encapsulant 154 may be dispensed over the carrier substrate 102 such that the conductive features 126/adhesion layers 152 and the interconnection dies 130 are buried or covered, and may be dispensed in gap regions between the conductive features 126/adhesion layers 152 and the interconnection dies 130.

As will be subsequently described in greater detail, the encapsulant 154 is formed of a material that includes a polymer resin, and the adhesion layers 152 are formed of an adhesive compound that chemically bonds to both the polymer resin of the encapsulant 154 and the metal of the conductive features 126. The adhesion strength between the conductive features 126 and the encapsulant 154 may thus be improved. The adhesion layers 152 are formed to a sufficient thickness to allow for a desired improvement in adhesion strength between the conductive features 126 and the encapsulant 154. For example, the adhesion layers 152 can be formed to a thickness T in the range of 5 nm to 1000 nm, such as a thickness in the range of 30 nm to 300 nm. Improving the adhesion strength between the conductive features 126 and the encapsulant 154 can help avoid delamination of the encapsulant 154 from the conductive features 126, particularly during subsequent processing such as reliability testing, thereby improving the manufacturing yield and reliability of the integrated circuit packages 100.

FIGS. 7A-7D are cross-sectional views of intermediate stages in the formation of the adhesion layers 152 and the encapsulant 154. Processing is illustrated and described for one conductive feature 126, but it should be appreciated that any number of conductive features 126 and the TSVs 136 (if they are exposed at the back sides of the interconnection dies 130) may be simultaneously processed.

Figure 7B:
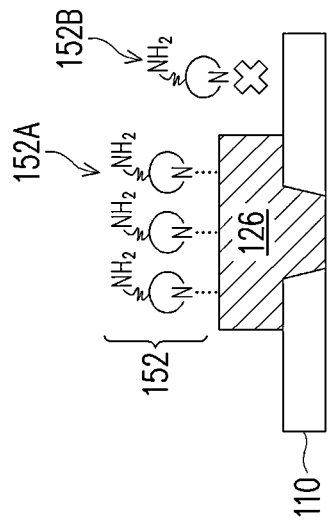
Figure 7A:
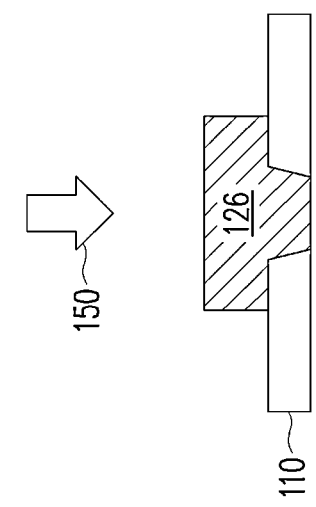

In FIG. 7A, the conductive features 126 are optionally pre-cleaned by a cleaning process 150. The cleaning process 150 may be performed to remove native oxides and/or residuals from the conductive features 126. The residuals may be etching byproducts from the forming of the conductive features 126 (e.g., from the etching of the seed layer 122, see FIG. 4). In some embodiments, the cleaning process 150 includes soaking the conductive features 126 in a cleaning solution that includes one or more acid(s) such as citric acid, hydrochloric acid, sulfuric acid, and the like. The conductive features 126 may be soaked in the cleaning solution by immersing them in the cleaning solution, spraying them with the cleaning solution, or the like. The conductive features 126 can be soaked in the cleaning solution for a duration in the range of 5 seconds to 10 minutes. During the soaking, the cleaning solution may be at room temperature (e.g., about 20° C.). In some embodiments, the cleaning process 150 further includes rinsing the conductive features 126 following the soaking to remove the cleaning solution. The conductive features 126 can be rinsed with water, such as deionized (DI) water, for a duration in the range of 5 seconds to 3 minutes. During the rinsing, the water may be at room temperature. In some embodiments, the cleaning process 150 further includes drying the conductive features 126 following the rinsing to remove the water. The conductive features 126 can be dried by exposing them to an environment containing an inert gas, such as nitrogen, for a duration in the range of 10 seconds to 10 minutes. During the drying, the environment may be at a temperature in the range of room temperature to 80° C.

In FIG. 7B, the adhesion layers 152 are conformally formed on the top surfaces and the sidewalls of conductive features 126. The adhesion layers 152 include one or more monolayers of an adhesive compound. In various embodiments: the adhesion layers 152 include a plurality of monolayers of a single adhesive compound; the adhesion layers 152 include a plurality of monolayers of different adhesive compounds; some or all of the adhesive compound(s) are organic compounds; and some or all the adhesive compound(s) are inorganic compounds. The adhesion layers 152 are formed by a deposition process that selectively deposits the adhesive compound on metal surfaces, and does not deposit the adhesive compound on semiconductor surfaces or dielectric surfaces.

In the illustrated embodiment, the adhesion layers 152 include an adhesive compound 152A which is an organic compound. One monolayer of the adhesive compound 152A is shown for illustration clarity, but it should be appreciated that a plurality of monolayers of the adhesive compound 152A may be formed. Each molecule of the adhesive compound 152A includes a head group and an end group. The head group is a nitrogen-containing aromatic compound (e.g., an aromatic compound having at least one nitrogen atom) which bonds to the metal (e.g., copper) of the conductive features 126. The aromatic compound is one that selectively reacts with metals (e.g., the conductive features 126) to form coordinate covalent bonds, and does not react with semiconductors or dielectrics to form bonds. In other words, the adhesive compound 152A is chemically inert to the materials of, e.g., the dielectric layer 110 and the substrates 132 (see FIG. 6), such that the adhesive compound 152A does not bond to the dielectric material of the dielectric layer 110 or the semiconductor material of the substrates 132. In some embodiments, the aromatic compound is an azole compound (e.g., a nitrogen-containing heterocyclic ring) such as triazole or thiazole. Other acceptable aromatic compounds may be used. The end group is an amine which, as will be subsequently described in greater detail, bonds to the material (e.g., polymer resin) of the encapsulant 154. In some embodiments, the amine is an amino group ($NH_2$). In some embodiments, the end group is a compound that can also bond to the head group, so that a multilayer of the adhesive compound 152A can be formed.

The adhesive compound 152A may be formed by a deposition process that includes soaking the conductive features 126 in an adhesive solution that includes an adhesive-containing precursor in water and/or an organic solvent. The conductive features 126 may be soaked in the adhesive solution by immersing them in the adhesive solution, spraying them with the adhesive solution, or the like. The adhesive-containing precursor contains the adhesive compound 152A. In embodiments where the adhesive compound 152A includes an azole compound, the adhesive-containing precursor can be an azole silane compound represented by the following chemical formula, in which X represents $-NH_2$; Y represents $-NH-$ or $-S-$; R represents $-CH_3$ or $-CH_2CH_3$, m represents an integer in the range of 1 to 12; and n represents o or an integer in the range of 1 to 3.

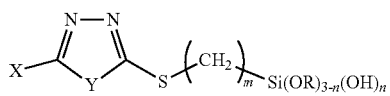

Such an azole silane compound contains an azole compound (e.g., the adhesive compound 152A) bonded to a silane compound. An example of a suitable azole silane compound is described in U.S. Pat. No. 9,688,704, which is incorporated herein by reference in its entirety. The adhesive-containing precursor in the adhesive solution can have a concentration in the range of 0.01% to 100% by weight. The adhesive solution can be acidic or basic, having a pH in the range of 5 to 12. During the soaking, the adhesive compound 152A dissociates from the adhesive-containing precursor and bonds to exposed metal surfaces, such as the top surfaces and the sidewalls of the conductive features 126. Continuing the previous example where the adhesive-containing precursor is an azole silane compound, one of the carbon double bonds with nitrogen in the azole compound breaks to allow the nitrogen to bond to the metal (e.g., copper) of the conductive features 126. As previously described, the adhesive compound 152B does not bond to semiconductor surfaces or dielectric surfaces, and so those surfaces can also be soaked in the adhesive solution without risk of depositing the adhesive compound 152B on those surfaces. During the soaking, the adhesive solution may be at a temperature in the range of room temperature to 80° C. The conductive features 126 can be soaked in the adhesive solution for a duration in the range of 5 seconds to 10 minutes. Performing the soaking with parameters in these ranges allows the adhesion layers 152 to be formed to a desired thickness (previously described). Performing the soaking with parameters outside of these ranges may not allow the adhesion layers 152 to be formed to the desired thickness.

In some embodiments, the deposition process further includes rinsing the conductive features 126 following the soaking to remove the adhesive solution. The conductive features 126 can be rinsed with water, such as deionized (DI) water, for a duration in the range of 5 seconds to 3 minutes. During the rinsing, the water may be at room temperature. In some embodiments, the deposition process further includes drying the conductive features 126 following the rinsing to remove the water. The conductive features 126 can be dried by exposing them to an environment containing air for a duration in the range of 10 seconds to 10 minutes. During the drying, the environment may be at a temperature in the range of room temperature to 80° C.

Figure 7D:
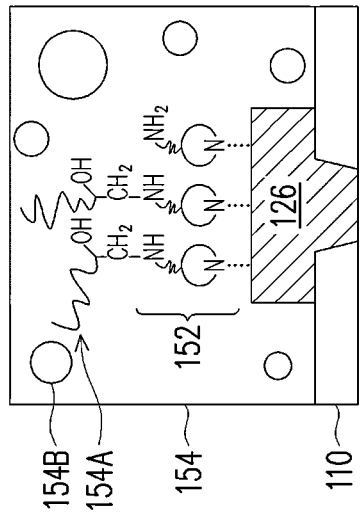
Figure 7C:
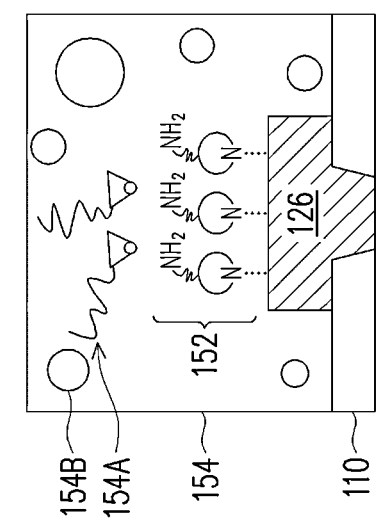

In FIG. 7C, the encapsulant 154 is dispensed around the conductive features 126. The encapsulant 154 may be formed of a molding compound, epoxy, or the like, which may be applied by compression molding, transfer molding, or the like. The encapsulant 108 and the encapsulant 154 may be formed of the same material, or may include different materials. In the illustrated embodiment, the encapsulant 154 includes a polymer resin 154A having fillers 154B disposed therein. The polymer resin 154A may be an epoxy resin, an acrylate resin, a polyimide resin, or the like. The fillers 154B may be formed of silica, barium sulfate, or the like. Other acceptable resins/fillers may be used. In some embodiments where the adhesive compound 152A includes an azole compound, the encapsulant 154 is an epoxy and the polymer resin 154A is an epoxy resin. The encapsulant 154 may be applied in liquid or semi-liquid form and then subsequently cured. Each molecule of the polymer resin 154A has an end group. In some embodiments, the end group is ethylene oxide which, as will be subsequently described in greater detail, can form a covalent bond with the end group (e.g., an amino group) of the adhesive compound 152A.

In FIG. 7D, bonds are formed between the material of the encapsulant 154 and the material of the adhesion layers 152. The bonds may be formed during, e.g., a process for curing the encapsulant 154. In other words, a curing process may be performed to simultaneously cure the encapsulant 154 and bond the encapsulant 154 to the adhesion layers 152. The curing process may be performed by annealing the encapsulant 154, such as at a temperature in the range of 150° C. to 250° C.

Continuing the previous example where the adhesive compound 152A includes end groups of amino and where the polymer resin 154A includes end groups of ethylene oxide, the curing process breaks bonds between NH groups and hydrogen in the adhesive compound 152A and breaks bonds between oxygen and carbon in the polymer resin 154A. The carbon from the polymer resin 154A is then able to bond to the NH groups in the adhesive compound 152A, thus forming covalent bonds between the adhesive compound 152A and the polymer resin 154A. The oxygen from the polymer resin 154A is also able to bond to the hydrogen from the adhesive compound 152A, thus forming OH groups. The covalent bonds between the adhesive compound 152A and the polymer resin 154A are strong, and chemically bond the conductive features 126 to the encapsulant 154. The adhesion strength between the conductive features 126 and the encapsulant 154 may thus be improved.

Although FIGS. 7A-7D illustrate and describe processing for one conductive feature 126, it should be appreciated that the same process may also form the adhesion layers 152 on the top surfaces of the TSVs 136 (if they are exposed at the back sides of the interconnection dies 130, see FIG. 6). As previously described, the adhesive compound 152A does not bond to semiconductor surfaces or dielectric surfaces, and so the surfaces of the substrates 132 can also be soaked in the adhesive solution without risk of depositing the adhesive compound 152A on those surfaces.

Figure 8:
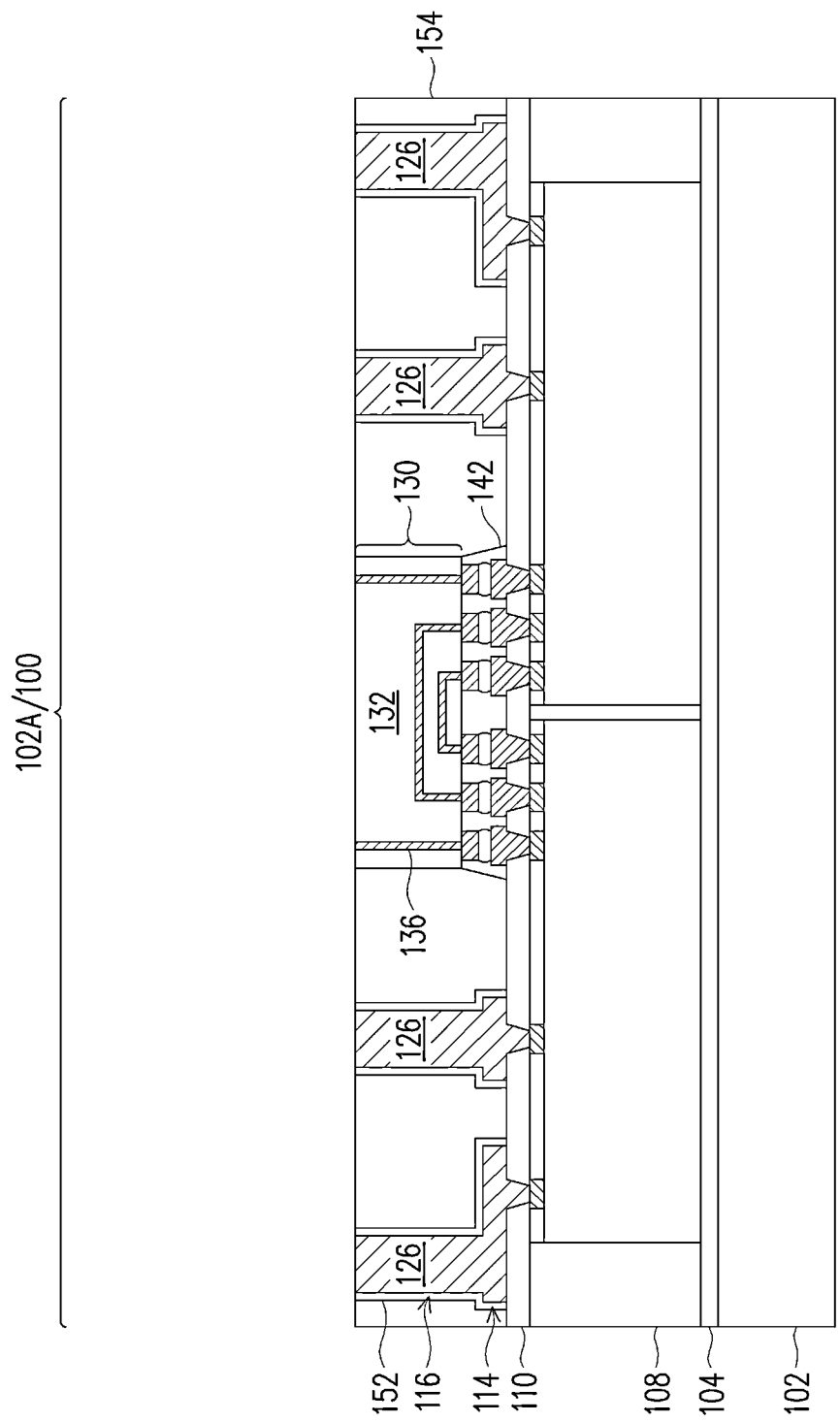

In FIG. 8, a removal process may be performed on the encapsulant 154 to expose the conductive features 126 and the TSVs 136. The removal process may remove material of the encapsulant 154, the adhesion layers 152, the TSVs 136, the substrates 132, and the conductive features 126 until the conductive features 126 and the TSVs 136 are exposed. The removal process may be a planarization process such as a chemical mechanical polish (CMP), an etch-back, combinations thereof, or the like. After the planarization process, top surfaces of the encapsulant 154, the adhesion layers 152, and the interconnection dies 130 (e.g., the substrates 132 and the TSVs 136) are substantially coplanar (within process variations). As will be subsequently described in greater detail, after the planarization process, top surfaces of the encapsulant 154 and the conductive features 126 (e.g., the through vias 116) may or may not be coplanar (within process variations). In some embodiments, the planarization process may be omitted, for example, if the conductive features 126 and the TSVs 136 are already exposed.

Figure 9:
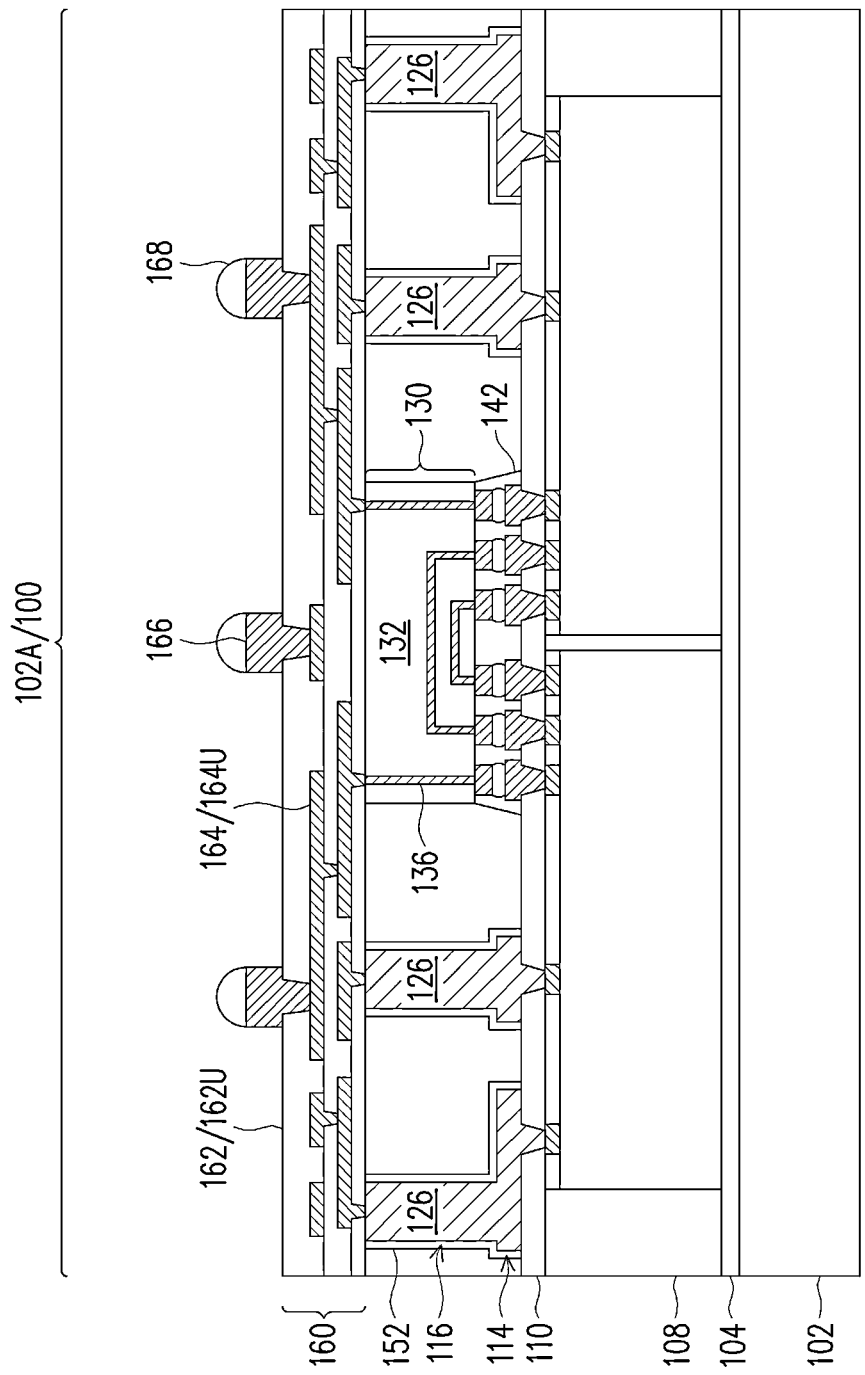

In FIG. 9, a redistribution structure 160 is formed on the top surfaces of the encapsulant 154, the adhesion layers 152, the conductive features 126 (e.g., the through vias 116), and the interconnection dies 130 (e.g., the substrates 132 and the TSVs 136). The redistribution structure 160 includes dielectric layers 162 and metallization layers 164 (sometimes referred to as redistribution layers or redistribution lines) among the dielectric layers 162. For example, the redistribution structure 160 may include a plurality of metallization layers 164 separated from each other by respective dielectric layers 162. The metallization layers 164 of the redistribution structure 160 are connected to the conductive features 126 (e.g., the through vias 116) and the interconnection dies 130 (e.g., the TSVs 136). Specifically, the metallization layers 164 are connected to the integrated circuit dies 50 by the conductive features 126 and the TSVs 136.

In some embodiments, the dielectric layers 162 are formed of a polymer, which may be a photo-sensitive material such as PBO, polyimide, a BCB-based polymer, or the like, may be patterned using a lithography mask. In other embodiments, the dielectric layers 162 are formed of a nitride such as silicon nitride; an oxide such as silicon oxide, PSG, BSG, BPSG; or the like. The dielectric layers 162 may be formed by spin coating, lamination, CVD, the like, or a combination thereof. After each dielectric layer 162 is formed, it is then patterned to expose underlying conductive features, such as portions of the underlying conductive features 126, TSVs 136, or metallization layers 164. The patterning may be by an acceptable process, such as by exposing the dielectrics layers to light when the dielectric layers 162 are a photo-sensitive material, or by etching using, for example, an anisotropic etch. If the dielectric layers 162 are photo-sensitive materials, the dielectric layers 162 can be developed after the exposure.

The metallization layers 164 each include conductive vias and/or conductive lines. The conductive vias extend through the dielectric layers 162, and the conductive lines extend along the dielectric layers 162. As an example to form a metallization layer, a seed layer (not illustrated) is formed over the respective underlying features. For example, the seed layer can be formed on a respective dielectric layer 162 and in the openings through the respective dielectric layer 162. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization layer. The patterning forms openings through the photoresist to expose the seed layer. A conductive material is formed in the openings of the photoresist and on the exposed portions of the seed layer. The conductive material may be formed by plating, such as electroless plating or electroplating from the seed layer, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization layer for one level of the redistribution structure 160.

The redistribution structure 160 is illustrated as an example. More or fewer dielectric layers 162 and metallization layers 164 than illustrated may be formed in the redistribution structure 160 by repeating or omitting the steps previously described.

Under-bump metallizations (UBMs) 166 are formed for external connection to the front-side redistribution structure 160. The UBMs 166 have bump portions on and extending along the major surface of the upper dielectric layer 162U of the redistribution structure 160, and have via portions extending through the upper dielectric layer 162U of the redistribution structure 160 to physically and electrically couple the upper metallization layer 164U of the redistribution structure 160. As a result, the UBMs 166 are electrically connected to the conductive features 126 (e.g., the through vias 116) and the interconnection dies 130 (e.g., the TSVs 136). The UBMs 166 may be formed of the same material as the metallization layers 164, and may be formed by a similar process as the metallization layers 164. In some embodiments, the UBMs 166 have a different size than the metallization layers 164.

Conductive connectors 168 are formed on the UBMs 166. The conductive connectors 168 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 168 may include a conductive material such as solder, copper, aluminum, gold, nickel, silver, palladium, tin, the like, or a combination thereof. In some embodiments, the conductive connectors 168 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 168 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 10:
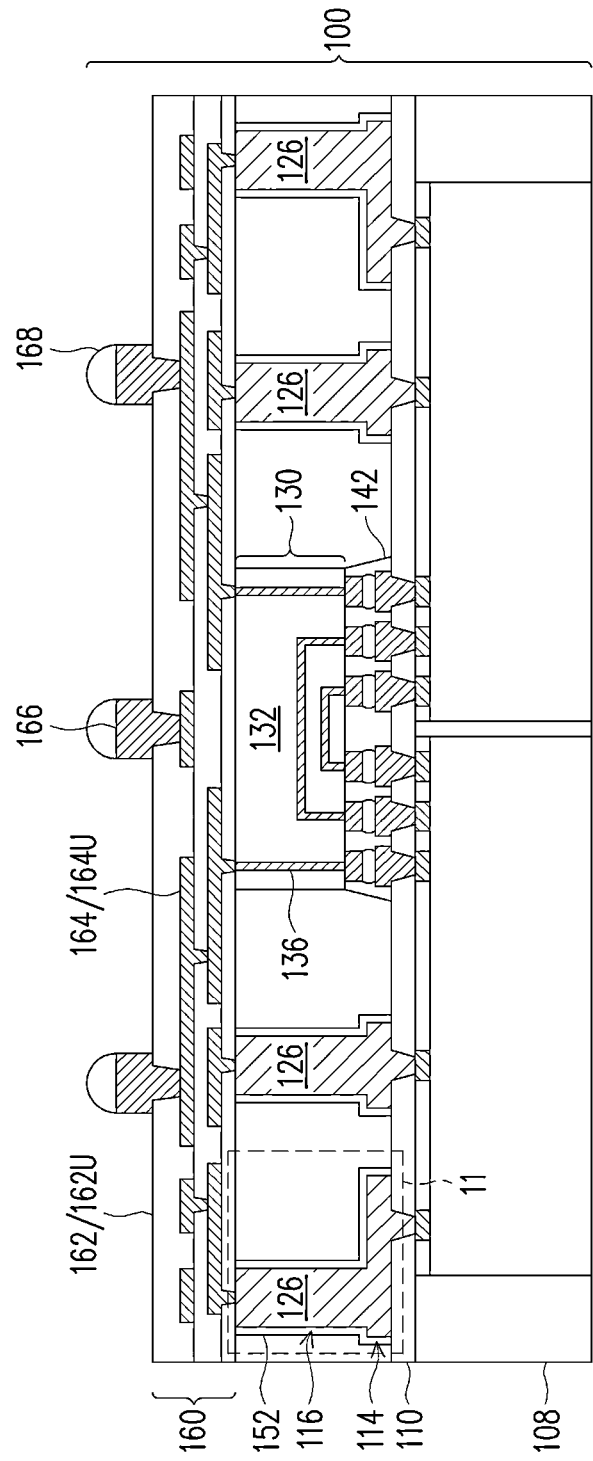

In FIG. 10, a carrier substrate debonding is performed to detach (or "debond") the carrier substrate 102 from the integrated circuit dies 50 and the encapsulant 108. In some embodiments, the debonding includes projecting a light such as a laser light or an UV light on the release layer 104 so that the release layer 104 decomposes under the heat of the light and the carrier substrate 102 can be removed.

Additional processing may be performed to complete formation of the integrated circuit packages 100. For example, the package regions 102A may be singulated to form a plurality of integrated circuit packages 100. The singulation process may include sawing along scribe line regions, e.g., between the package regions 102A. The sawing singulates the package regions 102A from one another, and the resulting integrated circuit packages 100 are from respective ones of the package regions 102A.

Figure 11:
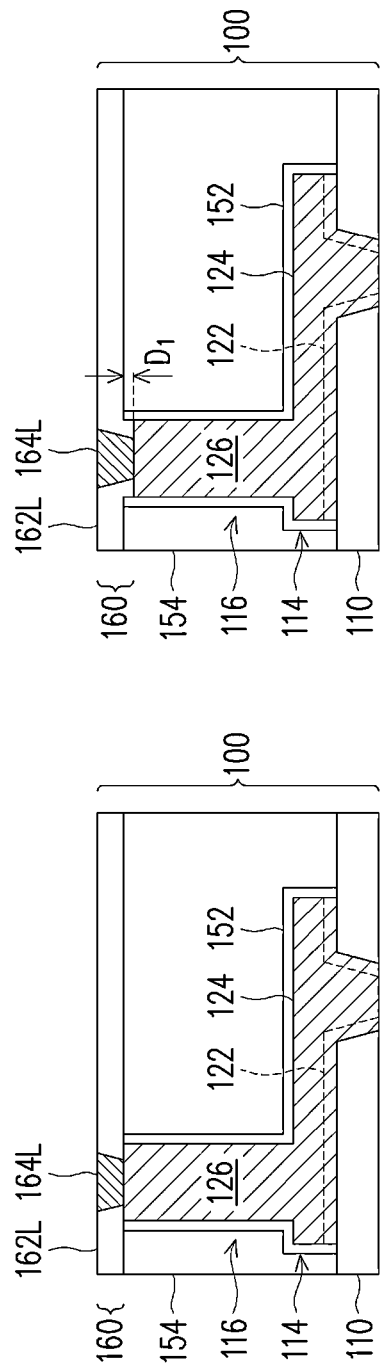
FIGS. 11A and 11B are cross-sectional views of integrated circuit packages, in accordance with some embodiments.

FIGS. 11A and 11B are cross-sectional views of integrated circuit packages 100, in accordance with some embodiments. Detailed views of a region 11 from FIG. 10 are illustrated. As more clearly shown, the adhesion layers 152 extend along the sidewalls of the seed layer 122 and the top surfaces and sidewalls the metal 124 of the corresponding conductive features 126. Specifically, the adhesion layers 152 extend along the sidewalls of both the through vias 116 and the UBMLs 114, and the top surfaces of the UBMLs 114.

As previously described, a planarization process may be performed on the encapsulant 154 to expose the conductive features 126. In some embodiments, no smearing occurs during the planarization process so that the top surfaces of the conductive features 126, the encapsulant 154, and the adhesion layers 152 are substantially coplanar (within process variations), as illustrated in FIG. 11A. In some embodiments, smearing occurs during the planarization process so that the top surfaces of the conductive features 126 are recessed below the top surfaces of the encapsulant 154 and the adhesion layers 152, as illustrated in FIG. 11B. For example, the top surfaces of the conductive features 126 can be recessed below the top surfaces of the encapsulant 154 and the adhesion layers 152 by a distance DI in the range of 0.1 µm to 1 µm. The smearing may be caused or avoided by controlling the removal rates of the materials of the encapsulant 154, the adhesion layers 152, and the conductive features 126 during the planarization process. When smearing occurs, the lower dielectric layer 162L of the redistribution structure 160 and the lower metallization layer 164L of the redistribution structure 160 are formed extending into the recesses over the conductive features 126 so that the bottom surfaces of the lower dielectric layer 162L and the lower metallization layer 164L are disposed closer to the dielectric layer 110 than the top surfaces of the adhesion layers 152 and the encapsulant 154. Thus, portions of the lower dielectric layer 162L contact and extend along the sidewalls of the adhesion layers 152.

Figure 12:
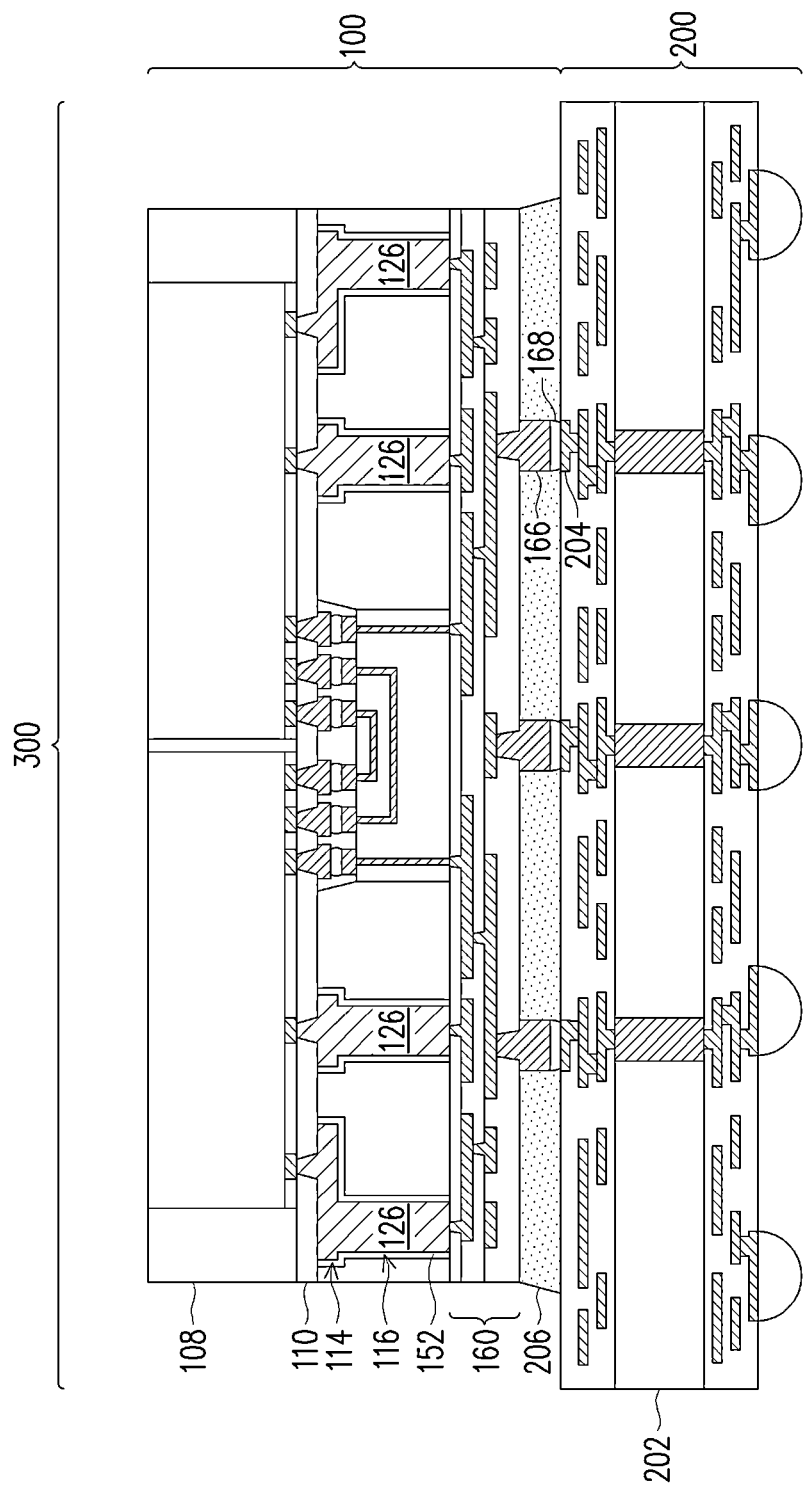
FIG. 12 is a cross-sectional view of an integrated circuit device, in accordance with some embodiments.

FIG. 12 is a cross-sectional view of an integrated circuit device 300, in accordance with some embodiments. The integrated circuit device 300 is formed by bonding an integrated circuit package 100 to a package substrate 200. The bonding process may be, e.g., a flip-chip bonding process.

After the integrated circuit package 100 is formed, it is flipped and attached to a package substrate 200 using the conductive connectors 168. The package substrate 200 may be an interposer, a printed circuit board (PCB), or the like. The package substrate 200 includes a substrate core 202 and bond pads 204 over the substrate core 202. The substrate core 202 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 202 may be a SOI substrate. Generally, an SOI substrate includes a layer of a semiconductor material such as epitaxial silicon, germanium, silicon germanium, SOI, SGOI, or combinations thereof. The substrate core 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other PCB materials or films. Build up films such as Ajinomoto Build-up Film (ABF) or other laminates may be used for substrate core 202.

The substrate core 202 may include active and/or passive devices (not separately illustrated). A wide variety of devices such as transistors, capacitors, resistors, combinations of these, and the like may be used to generate the structural and functional designs for the device stack. The devices may be formed using any suitable methods.

The substrate core 202 may also include metallization layers and vias, with the bond pads 204 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 202 is substantially free of active and passive devices.

In some embodiments, the conductive connectors 168 are reflowed to attach the UBMs 166 to the bond pads 204. The conductive connectors 168 electrically and/or physically couple the package substrate 200, including metallization layers in the substrate core 202, to the integrated circuit package 100, including metallization layers in the redistribution structure 160. In some embodiments, a solder resist is formed on the substrate core 202. The conductive connectors 168 may be disposed in openings in the solder resist to be electrically and mechanically coupled to the bond pads 204. The solder resist may be used to protect areas of the package substrate 200 from external damage.

An underfill 206 may be formed between the integrated circuit package 100 and the package substrate 200, surrounding the conductive connectors 168 to reduce stress and protect the joints resulting from the reflowing the conductive connectors 168. In some embodiments, the underfill 206 is formed by a capillary flow process after the integrated circuit package 100 is attached or is formed by a suitable deposition method before the integrated circuit package 100 is attached. In some embodiments, the conductive connectors 168 have an epoxy flux (not separately illustrated) formed thereon before they are reflowed, with at least some of the epoxy portion of the epoxy flux remaining after the integrated circuit package 100 is attached to the package substrate 200. This remaining epoxy portion may act as the underfill 206.

In some embodiments, passive devices (e.g., surface mount devices (SMDs), not separately illustrated) may also be attached to the integrated circuit package 100 (e.g., to the UBMs 166) or to the package substrate 200 (e.g., to the bond pads 204). For example, the passive devices may be bonded to a same surface of the integrated circuit package 100 or the package substrate 200 as the conductive connectors 168. The passive devices may be attached to the integrated circuit package 100 prior to mounting the integrated circuit package 100 to the package substrate 200, or may be attached to the package substrate 200 after mounting the integrated circuit package 100 to the package substrate 200.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 13-17 are cross-sectional views of intermediate stages in the manufacturing of integrated circuit packages 400, in accordance with some embodiments. Specifically, integrated circuit packages 400 are formed by packaging one or more integrated circuit dies 50 in package regions 102A. Processing of one package region 102A is illustrated, but it should be appreciated that any number of package regions 102A can be simultaneously processed. The package regions 102A will be singulated in subsequent processing to form the integrated circuit packages 400. The singulated integrated circuit packages 400 may be fan-out packages, such as integrated fan-out (InFO) packages.

Figure 13:
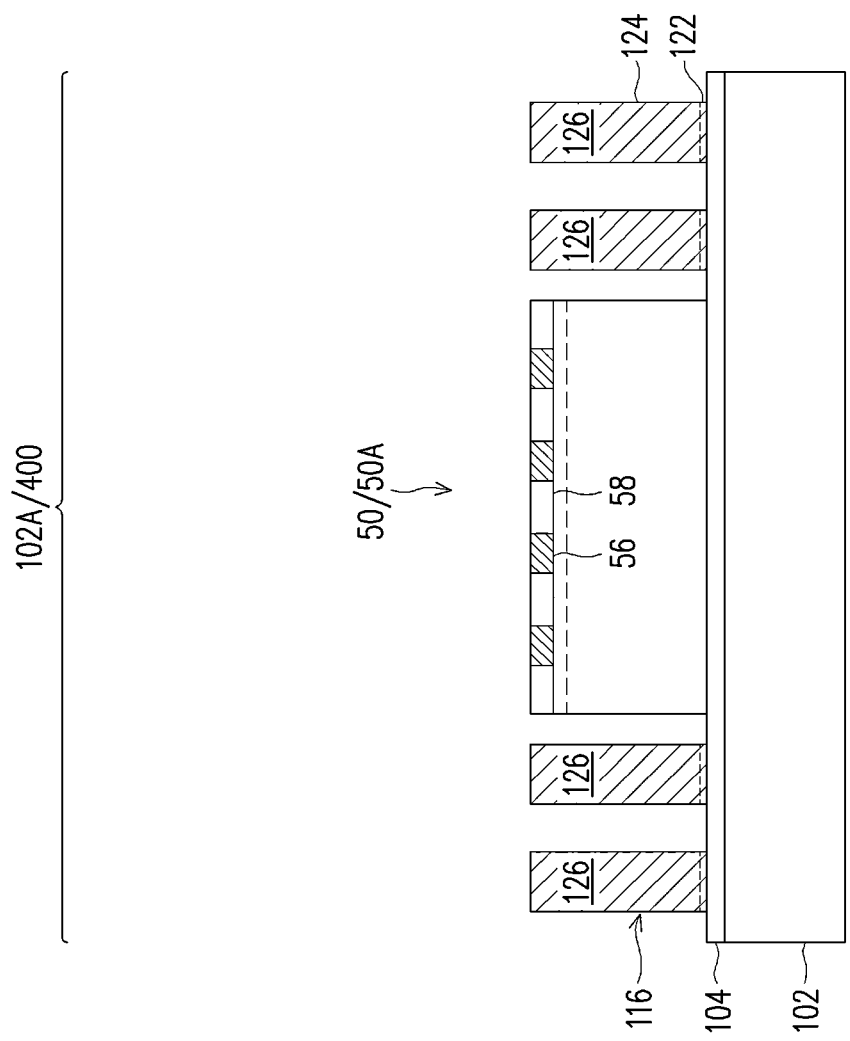
FIGS. 13-17 are cross-sectional views of intermediate stages in the manufacturing of integrated circuit packages, in accordance with some embodiments.

In FIG. 13, a carrier substrate 102 is provided, and a release layer 104 is formed on the carrier substrate 102. The carrier substrate 102 and the release layer 104 may be similar to those described for FIG. 2, and may be formed by similar processes.

Through vias 116 are formed on the release layer 104. As an example to form the through vias 116, a seed layer 122 is formed over the release layer 104. The seed layer 122 may be similar to that described for FIG. 4, and may be formed by a similar process. A photoresist is formed and patterned on the seed layer. The photoresist may be formed by spin coating or the like and may be exposed to light for patterning. The pattern of the photoresist corresponds to the through vias 116. The patterning forms openings through the photoresist to expose the seed layer 122. A metal 124 is then formed in the openings of the photoresist and on the exposed portions of the seed layer 122. The metal 124 may be similar to that described for FIG. 4, and may be formed by a similar process. The photoresist and portions of the seed layer 122 on which the metal 124 is not formed are removed. The photoresist may be removed by an acceptable ashing or stripping process, such as using an oxygen plasma or the like. Once the photoresist is removed, exposed portions of the seed layer 122 are removed, such as by using an acceptable etching process, such as by wet or dry etching. The remaining portions of the seed layer 122 and the metal 124 form conductive features 126 (corresponding to the through vias 116).

Integrated circuit dies 50 (e.g., a first integrated circuit die 50A) are placed on the release layer 104. The integrated circuit dies 50 are adjacent the conductive features 126 on the release layer 104. A desired type and quantity of integrated circuit dies 50 are placed in each of the package regions 102A, in a similar manner as described for FIG. 2.

Figure 14:
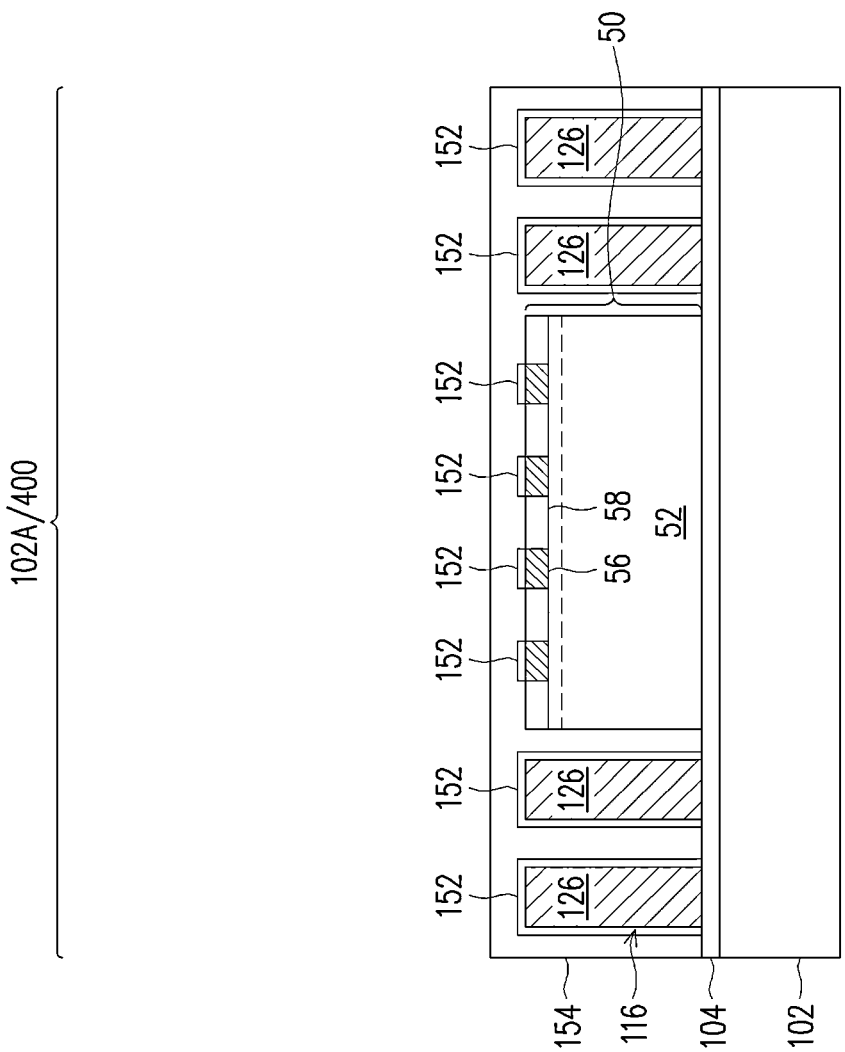

In FIG. 14, adhesion layers 152 are conformally formed on the top surfaces and the sidewalls of the conductive features 126 (e.g., the through vias 116). The adhesion layers 152 may also be formed on the top surfaces of the die connectors 56 (if they are exposed at the front sides of the integrated circuit dies 50). An encapsulant 154 is then formed around the conductive features 126 and the integrated circuit dies 50, so that the adhesion layers 152 are disposed between the encapsulant 154 and the conductive features 126. The adhesion layers 152 and the encapsulant 154 may be similar to those described for FIGS. 6-7D, and may be formed by similar processes. Specifically, the adhesion layers 152 are formed by selectively depositing an adhesive compound that is chemically inert to the materials of, e.g., the release layer 104, the semiconductor substrates 52, and the dielectric layers 58.

Figure 15:
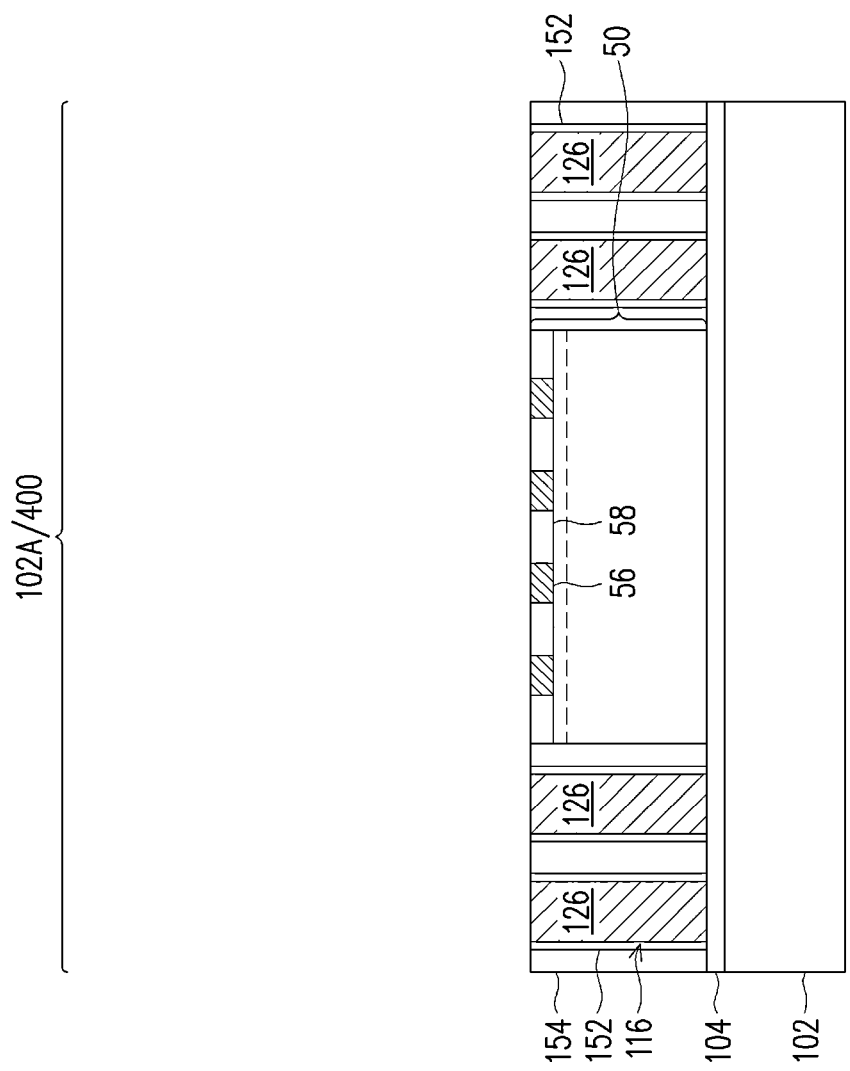

In FIG. 15, a removal process may be performed on the encapsulant 154 to expose the conductive features 126 (e.g., the through vias 116) and the integrated circuit dies 50 (e.g., the die connectors 56 and the dielectric layer 58). The removal process may be a planarization process such as a chemical mechanical polish (CMP), an etch-back, combinations thereof, or the like. After the planarization process, top surfaces of the encapsulant 154, the adhesion layers 152, and the integrated circuit dies 50 (e.g., the die connectors 56 and the dielectric layer 58) are substantially coplanar (within process variations). As will be subsequently described in greater detail, after the planarization process, top surfaces of the encapsulant 154 and the conductive features 126 may or may not be coplanar (within process variations). In some embodiments, the planarization process may be omitted, for example, if the conductive features 126 and the die connectors 56 are already exposed.

Figure 16:
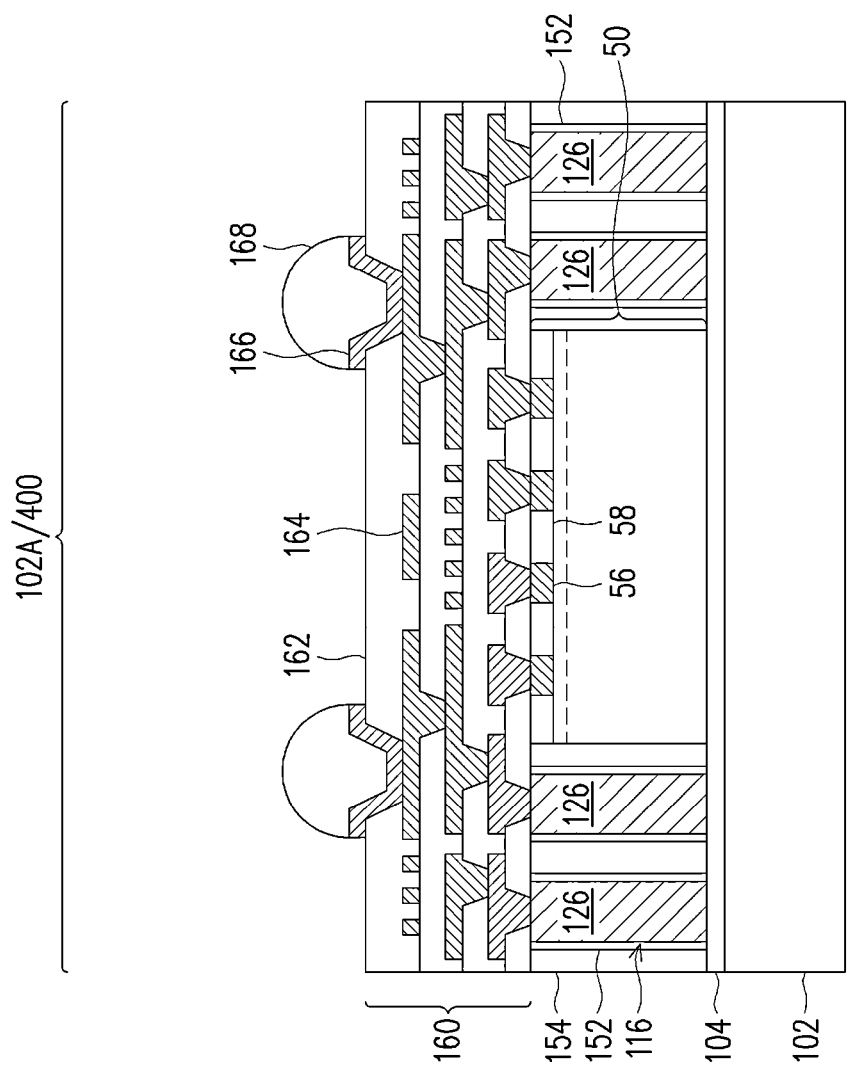

In FIG. 16, a redistribution structure 160 is formed on the top surfaces of the encapsulant 154, the adhesion layers 152, the conductive features 126 (e.g., the through vias 116), and the integrated circuit dies 50 (e.g., the die connectors 56 and the dielectric layer 58). The redistribution structure 160 includes dielectric layers 162 and metallization layers 164 (sometimes referred to as redistribution layers or redistribution lines) among the dielectric layers 162. The redistribution structure 160 (including the dielectric layers 162 and the metallization layers 164) may be similar to that described for FIG. 9, and may be formed by a similar process. The metallization layers 164 of the redistribution structure 160 are connected to the conductive features 126 and the integrated circuit dies 50.

Under-bump metallizations (UBMs) 166 are formed for external connection to the front-side redistribution structure 160. Conductive connectors 168 are formed on the UBMs 166. The UBMs 166 and the conductive connectors 168 may be similar to those described for FIG. 9, and may be formed by a similar process.

Figure 17:
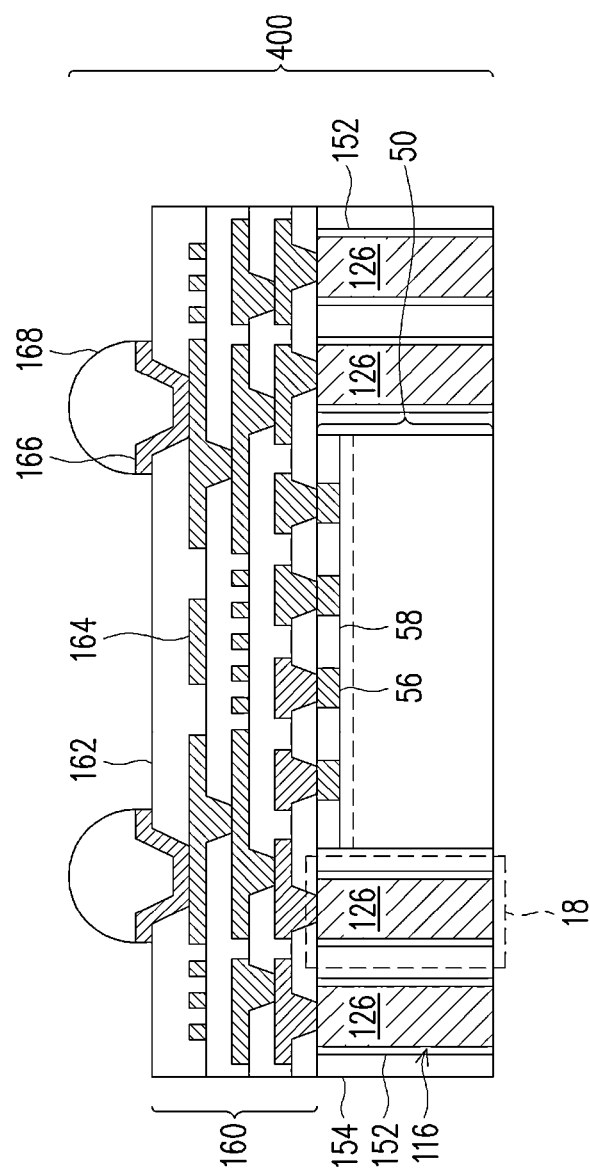

In FIG. 17, a carrier substrate debonding is performed to detach (or "debond") the carrier substrate 102 from the integrated circuit dies 50 and the encapsulant 154. Additional processing may be performed to complete formation of the integrated circuit packages 400. For example, the package regions 102A may be singulated to form a plurality of integrated circuit packages 400. The debonding and singulation processes may be similar to those described for FIG. 10.

Figures 18A, 18B:
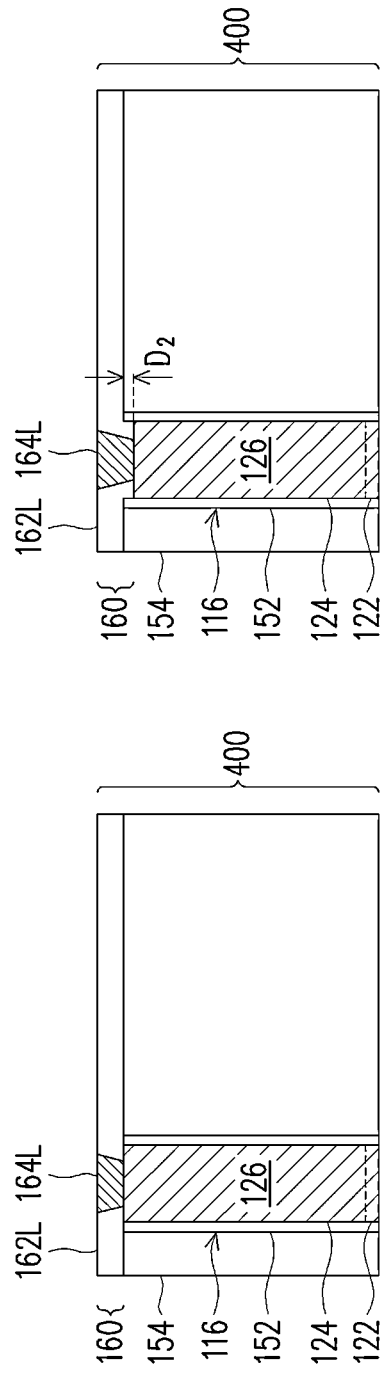
FIGS. 18A and 18B are cross-sectional views of integrated circuit packages, in accordance with some embodiments.

FIGS. 18A and 18B are cross-sectional views of integrated circuit packages 400, in accordance with some embodiments. Detailed views of a region 18 from FIG. 17 are illustrated. As more clearly shown, the adhesion layers 152 extend along the sidewalls of the seed layer 122 and the top surfaces and sidewalls the metal 124 of the corresponding conductive features 126. Specifically, the adhesion layers 152 extend along the sidewalls of the through vias 116.

As previously described, a planarization process may be performed on the encapsulant 154 to expose the conductive features 126. In some embodiments, no smearing occurs during the planarization process so that the top surfaces of the conductive features 126, the encapsulant 154, and the adhesion layers 152 are substantially coplanar (within process variations), as illustrated in FIG. 18A. In some embodiments, smearing occurs during the planarization process so that the top surfaces of the conductive features 126 are recessed below the top surfaces of the encapsulant 154 and the adhesion layers 152, as illustrated in FIG. 18B. For example, the top surfaces of the conductive features 126 can be recessed below the top surfaces of the encapsulant 154 and the adhesion layers 152 by a distance $D_2$ in the range of 0.1 µm to 1 µm. The smearing may be caused or avoided by controlling the removal rates of the materials of the encapsulant 154, the adhesion layers 152, and the conductive features 126 during the planarization process. When smearing occurs, the lower dielectric layer 162L of the redistribution structure 160 and the lower metallization layer 164L of the redistribution structure 160 are formed extending into the recesses over the conductive features 126 so that the bottom surfaces of the lower dielectric layer 162L and the lower metallization layer 164L are disposed closer to the release layer 104 (when present, see FIG. 16) than the top surfaces of the adhesion layers 152 and the encapsulant 154. Thus, portions of the lower dielectric layer 162L contact and extend along the sidewalls of the adhesion layers 152.

Figure 19:
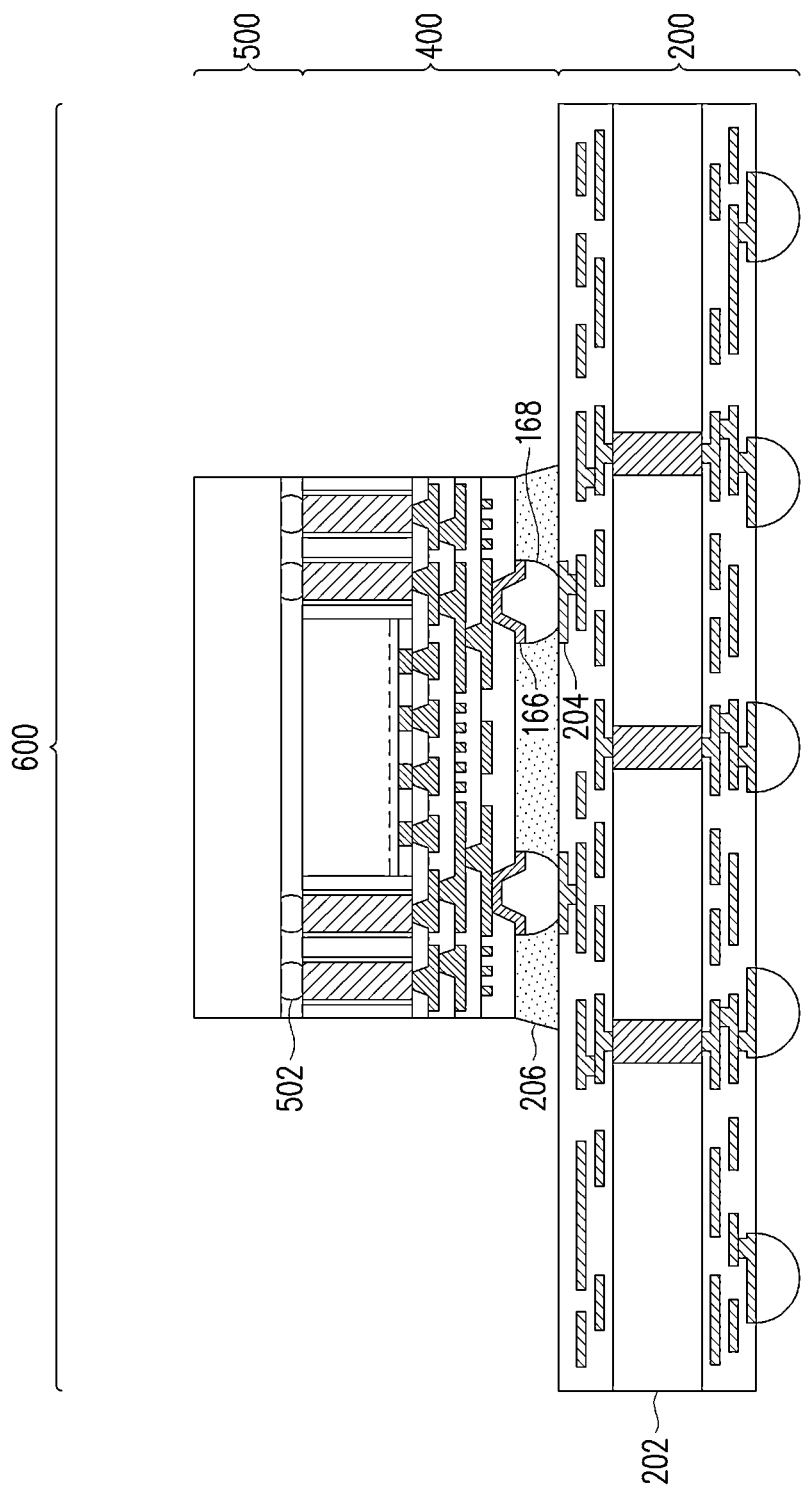
FIG. 19 is a cross-sectional view of an integrated circuit device, in accordance with some embodiments.

FIG. 19 is a cross-sectional view of an integrated circuit device 600, in accordance with some embodiments. The integrated circuit device 600 is formed by bonding an integrated circuit package 400 to a package substrate 200. The bonding process may be similar to that described for FIG. 12.

In some embodiments, an integrated circuit package 500 is bonded to the integrated circuit package 400 to form a package-on-package (POP) device. The integrated circuit package 500 may be similar to the integrated circuit package 400 (e.g., may include an encapsulant, integrated circuit devices embedded in the encapsulant, and a redistribution structure on the integrated circuit devices and the encapsulant). The integrated circuit package 500 may be bonded to conductive features 126 of the integrated circuit package 400 with conductive connectors 502. The conductive connectors 502 may be similar to the conductive connectors 168 described for FIG. 9, and may be formed by a similar process.

Figure 20:
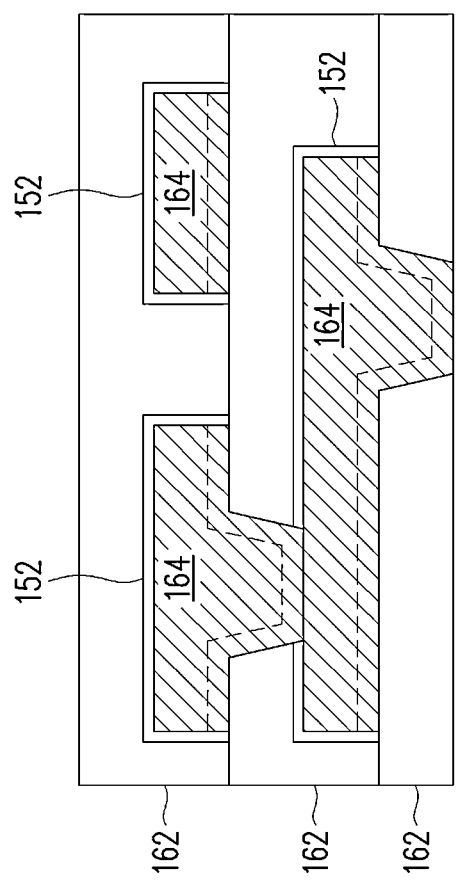
FIG. 20 is a cross-sectional view of an integrated circuit package, in accordance with some embodiments.

Some embodiments contemplate use of the adhesion layers 152 around conductive features in other contexts. It should be appreciated that the adhesion layers 152 may be used to improve the adhesion strength between a metal and any surrounding material that includes a polymer resin. For example, as shown by FIG. 20, adhesion layers 152 can be formed around metallization layers 164 of a redistribution structure 160 for an integrated circuit package. Specifically, the adhesion layers 152 can be formed on the exposed surfaces (e.g., sidewalls and/or top surfaces) of each metallization layer 164 before the overlying dielectric layer 162 is formed, to form covalent bonds between the materials of the adhesion layers 152 and the metallization layer 164. When the dielectric layers 162 are formed of a material that includes a polymer resin, the polymer resin of the dielectric layers 162 bonds to the adhesion layers 152, to form covalent bonds between the materials of the adhesion layers 152 and the dielectric layers 162.

Embodiments may achieve advantages. Forming the adhesion layers 152 improves the adhesion strength between the conductive features 126 and the encapsulant 154. Improving the adhesion strength between the conductive features 126 and the encapsulant 154 can help avoid delamination of the encapsulant 154 from the conductive features 126, particularly during subsequent processing such as reliability testing, thereby improving the manufacturing yield and reliability of the integrated circuit packages 100.

In an embodiment, a device includes: a semiconductor die including a semiconductor material; a through via adjacent the semiconductor die, the through via including a metal; an encapsulant around the through via and the semiconductor die, the encapsulant including a polymer resin; and an adhesion layer between the encapsulant and the through via, the adhesion layer including an adhesive compound having an aromatic compound and an amino group, the amino group bonded to the polymer resin of the encapsulant, the aromatic compound bonded to the metal of the through via, the aromatic compound being chemically inert to the semiconductor material of the semiconductor die. In some embodiments of the device, the aromatic compound is an azole compound and the polymer resin is an epoxy resin. In some embodiments, the device further includes: a dielectric layer including a dielectric material, the aromatic compound being chemically inert to the dielectric material of the dielectric layer; and an under-bump metallurgy layer (UBML) having a line portion on the dielectric layer and having a via portion extending through the dielectric layer, the through via disposed on the line portion of the UBML. In some embodiments of the device, the semiconductor die is an integrated circuit die. In some embodiments of the device, the semiconductor die is an interconnection die.

In an embodiment, a device includes: a first integrated circuit die including a die connector; a first encapsulant around the first integrated circuit die; a first dielectric layer on the first encapsulant and the first integrated circuit die; a conductive feature including a metal layer having a lower via portion, a line portion, and an upper via portion, the lower via portion extending through the first dielectric layer to be connected to the die connector of the first integrated circuit die, the line portion extending along the first dielectric layer, the upper via portion disposed on the line portion, the upper via portion laterally offset from the lower via portion; a first adhesion layer extending along sidewalls of the line portion and the upper via portion of the conductive feature, a material of the first adhesion layer bonded to a material of the conductive feature; and a second encapsulant around the first adhesion layer, a material of the second encapsulant bonded to the material of the first adhesion layer. In some embodiments, the device further includes: a second integrated circuit die, the first encapsulant disposed around the second integrated circuit die; and an interconnection die, the second encapsulant disposed around the interconnection die, the interconnection die connecting the first integrated circuit die to the second integrated circuit die. In some embodiments, the device further includes: a redistribution structure on the second encapsulant, the first adhesion layer, and the conductive feature, the redistribution structure including a redistribution line connected to the conductive feature; and a package substrate connected to the redistribution line of the redistribution structure. In some embodiments of the device, the redistribution structure further includes: a second adhesion layer on surfaces of the redistribution line, a material of the second adhesion layer bonded to a material of the redistribution line; and a second dielectric layer around the second adhesion layer, a material of the second dielectric layer bonded to the material of the second adhesion layer. In some embodiments of the device, top surfaces of the second encapsulant, the first adhesion layer, and the conductive feature are substantially coplanar. In some embodiments of the device, top surfaces of the second encapsulant and the first adhesion layer are substantially coplanar, and a top surface of the conductive feature is recessed from the top surfaces of the second encapsulant and the first adhesion layer.

In an embodiment, a method includes: placing a semiconductor die adjacent to a through via, the through via including a metal, the semiconductor die including a semiconductor material; soaking the semiconductor die and the through via in an adhesive-containing precursor, the adhesive-containing precursor including an adhesive compound, the adhesive compound bonding to the metal of the through via to form an adhesion layer on the through via, the adhesive compound not bonding to the semiconductor material of the semiconductor die; dispensing an encapsulant around the semiconductor die and the adhesion layer, the encapsulant including a polymer resin; and forming covalent bonds between the polymer resin of the encapsulant and the adhesive compound of the adhesion layer. In some embodiments of the method, forming the covalent bonds includes curing the encapsulant. In some embodiments of the method, soaking the semiconductor die and the through via in the adhesive-containing precursor includes soaking the semiconductor die and the through via in an adhesive solution including the adhesive-containing precursor in water, the adhesive solution having a pH in a range of 5 to 12, the adhesive solution being at a temperature in a range of 20° C. to 80° C., the semiconductor die and the through via soaked in the adhesive solution for a duration in a range of 5 seconds to 10 minutes. In some embodiments of the method, the adhesion layer includes one monolayer of the adhesive compound. In some embodiments of the method, the adhesion layer includes a multilayer of the adhesive compound. In some embodiments of the method, the semiconductor die includes a through-substrate via (TSV), the adhesive compound bonding to a material of the TSV. In some embodiments, the method further includes: planarizing the encapsulant and the adhesion layer to remove portions of the adhesion layer on the top surfaces of the TSV and the through via. In some embodiments of the method, the adhesive-containing precursor is an azole silane compound, and the adhesive compound includes an azole compound and an amino group, the azole compound bonding to the metal of the through via, the amino group bonding to the polymer resin of the encapsulant. In some embodiments of the method, the azole compound is triazole or thiazole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor die comprising a semiconductor material;
   a through via adjacent the semiconductor die, the through via comprising a metal;
   an encapsulant around the through via and the semiconductor die, the encapsulant comprising a molding compound; and
   an adhesion layer between the encapsulant and the through via, the adhesion layer comprising an adhesive compound, the adhesive compound bonded to the molding compound of the encapsulant, the adhesive compound bonded to the metal of the through via, the adhesive compound being chemically inert to the semiconductor material of the semiconductor die.

2. The device of claim 1, wherein the adhesive compound comprises an aromatic compound and an amine, and the molding compound comprises a polymer resin.

3. The device of claim 1, further comprising:
   a redistribution structure on the encapsulant, the redistribution structure comprising redistribution lines that are connected to the through via and the semiconductor die.

4. The device of claim 3, further comprising:
   a package substrate connected to the redistribution lines of the redistribution structure.

5. The device of claim 1, further comprising:
   a dielectric layer comprising a dielectric material, the adhesive compound being chemically inert to the dielectric material of the dielectric layer; and
   an under-bump metallurgy layer having a line portion on the dielectric layer, the through via disposed on the line portion of the under-bump metallurgy layer, the under-bump metallurgy layer comprising a metal, the adhesive compound bonded to the metal of the under-bump metallurgy layer.

6. The device of claim 1, wherein the semiconductor die comprises active devices.

7. The device of claim 1, wherein the semiconductor die is free of active devices.

8. The device of claim 1, wherein a top surface of the encapsulant is substantially coplanar with a top surface of the adhesion layer and a top surface of the through via.

9. The device of claim 1, wherein a top surface of the encapsulant is substantially coplanar with a top surface of the adhesion layer, and a top surface of the through via is recessed from the top surface of the encapsulant and the top surface of the adhesion layer.

10. A device comprising:
a plurality of integrated circuit dies;
a first encapsulant around the integrated circuit dies;
a dielectric layer over the first encapsulant;
an interconnection die over the dielectric layer, the interconnection die comprising die bridges that interconnect the integrated circuit dies;
a second encapsulant around the interconnection die;
a through-mold via extending through the second encapsulant; and
an adhesion layer between the through-mold via and the second encapsulant, the adhesion layer bonded to the through-mold via and the second encapsulant, the interconnection die and the dielectric layer being substantially free of the adhesion layer.

11. The device of claim 10, wherein the interconnection die further comprises a through-substrate via.

12. The device of claim 11, further comprising:
a redistribution structure over the second encapsulant, the redistribution structure comprising redistribution lines that are connected to the through-mold via and the through-substrate via; and
a package substrate connected to the redistribution lines of the redistribution structure.

13. The device of claim 10, wherein the through-mold via comprises a metal, the second encapsulant comprises a resin, the adhesion layer comprises an aromatic compound and an amine, the aromatic compound is chemically bonded to the metal, and the amine is chemically bonded to the resin.

14. The device of claim 10, further comprising:
an under-bump metallurgy layer over the dielectric layer, the through-mold via disposed over the under-bump metallurgy layer, the adhesion layer disposed between the under-bump metallurgy layer and the second encapsulant.

15. A device comprising:
a dielectric layer;
an under-bump metallurgy layer having a line portion on the dielectric layer;
a through via on the line portion of the under-bump metallurgy layer, the through via comprising a metal;
an adhesion layer on a sidewall of the through via, a top surface of the line portion, and a sidewall of the line portion, the adhesion layer comprising an adhesive compound, the adhesive compound of the adhesion layer chemically bonded to the metal of the through via;
an encapsulant around the adhesion layer, the encapsulant comprising a molding compound, the molding compound of the encapsulant chemically bonded to the adhesive compound of the adhesion layer; and
a redistribution structure on the encapsulant, the redistribution structure comprising a redistribution line connected to the through via.

16. The device of claim 15, further comprising:
a package substrate connected to the redistribution line of the redistribution structure.

17. The device of claim 15, wherein a top surface of the through via is substantially coplanar with a top surface of the encapsulant.

18. The device of claim 15, wherein a top surface of the through via is below a top surface of the encapsulant.

19. The device of claim 15, wherein the adhesion layer is one monolayer of the adhesive compound.

20. The device of claim 15, wherein the adhesion layer is a plurality of monolayers of the adhesive compound.

* * * * *